United States Patent
Yusa

(10) Patent No.: US 8,093,898 B2
(45) Date of Patent: Jan. 10, 2012

(54) NUCLEAR MAGNETIC RESONANCE IMAGING DEVICE, AND IMAGING SYSTEM AND METHOD USING THE SAME

(75) Inventor: Go Yusa, Sendai (JP)

(73) Assignee: Japan Science and Technology Agency, Kawaguchi-Shi, Saitama (JP)

( * ) Notice: Subject to any disclaimer, the term of this patent is extended or adjusted under 35 U.S.C. 154(b) by 309 days.

(21) Appl. No.: 12/516,646

(22) PCT Filed: Nov. 30, 2007

(86) PCT No.: PCT/JP2007/073138
§ 371 (c)(1),
(2), (4) Date: Sep. 11, 2009

(87) PCT Pub. No.: WO2008/066146
PCT Pub. Date: Jun. 5, 2008

(65) Prior Publication Data
US 2010/0013480 A1    Jan. 21, 2010

(30) Foreign Application Priority Data

Nov. 30, 2006    (JP) .................................. 2006-324443

(51) Int. Cl.
*G01V 3/00* (2006.01)
(52) U.S. Cl. ........................................ 324/318; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 6,887,365 B2* | 5/2005 | Naughton | ..................... | 205/104 |
| 6,977,503 B2* | 12/2005 | Prado | ............................ | 324/319 |
| 7,742,799 B2* | 6/2010 | Mueller et al. | ................ | 600/410 |

(Continued)

FOREIGN PATENT DOCUMENTS

EP    0512345    11/1992

(Continued)

OTHER PUBLICATIONS

R. J. Sutherland, et al., Three-Dimensional NMR Imaging Using Selective Excitation, J. Phys. E: Sci. Instrum, vol. 11, 1978, pp. 79-83, XP002597855.

(Continued)

*Primary Examiner* — Brij Shrivastav
(74) *Attorney, Agent, or Firm* — Patterson & Sheridan, LLP

(57) ABSTRACT

A nuclear magnetic resonance imaging device 1A is configured by a substrate, a magnetic field applying electrode group 20 provided being integrated on a measurement surface of the substrate, for setting a local measurement position in a measurement region 12 of nuclear magnetic resonance by applying a magnetic field to the region 12, and an RF antenna 15 provided at a predetermined position with respect to the substrate for irradiating the measurement region 12 with an RF pulse. Further, the electrode group 20 is configured so as to have a uniform magnetic field electrode 25 that applies a uniform magnetic field to the region 12, first gradient magnetic field electrodes 30, 35 that apply a gradient magnetic field in the x-axis direction, and second gradient magnetic field electrodes 40, 45 that apply a gradient magnetic field in the y-axis direction. As a result, a nuclear magnetic resonance imaging device capable of image acquisition of a measurement object with a high resolution, and an imaging system and imaging method using the same can be realized.

16 Claims, 10 Drawing Sheets

U.S. PATENT DOCUMENTS

| | | | | |
|---|---|---|---|---|
| 7,952,352 B2 * | 5/2011 | Ogawa et al. | | 324/307 |
| 2004/0155659 A1 | 8/2004 | Prado | | |
| 2010/0004528 A1 * | 1/2010 | Weiss et al. | | 600/411 |

FOREIGN PATENT DOCUMENTS

| | | |
|---|---|---|
| JP | 2000-051174 | 2/2000 |
| JP | 2003-329756 | 11/2003 |
| JP | 2006-066603 | 3/2006 |
| JP | 2006-135054 | 5/2006 |
| JP | 2006-158767 | 6/2006 |
| JP | 2006-204551 | 8/2006 |
| JP | 2006-334238 | 12/2006 |
| WO | WO 2005/073695 | 8/2005 |

OTHER PUBLICATIONS

P. C. Lauterbur, et al., Zeugmatographic High Resolution Nuclear Magnetic Resonance Spectroscopy, Images of Chemical Inhomogeneity Within Macroscopic Objects, JACS, vol. 97, 1975, pp. 6866-6868, XP002597856.

Stephen F. Keevil, Topical Review: Spatial Localization in Nuclear Magnetic Resonance Spectroscopy, Physics in Medicine and Biology, Taylor and Francis LTD, London, GB LNKD-D0I: 10.1088/0031-9155/51/16/R01, vol. 51, No. 16, ISSN: 0031-9155, Aug. 21, 2006, pR579-pR636, XP020095902.

P. J. M. Van Bentum, et al., Towards Nuclear Magnetic Resonance (MU)-Spectroscopy and (MU)-Imaging, Analyst, Royal Society of Chemistry, GB Lnkd-D01:10.1039/B404497P, vol. 129, No. 9, ISSN: 0003-2654, Jan. 1, 2004, pp. 793-803, XP009077035.

A. G. Goloshevsky, et al., Integration of Biaxial Planar Gradient Coils and an RF Microcoil for NMR Flow Imaging: Integration of Biaxial Planar Gradient Coils and an RF Microcoil for NMR Flow Imaging, Measurement Science and Technology, IOP, Bristol, GB LNKD-Doi:10.1088/0957-0233/16/2/024, vol. 16, No. 2, ISSN: 0957-0233, Feb. 1, 2005, pp. 505-512, XP020090516.

M J. D. Mallett, et al., Stray Field Imaging by Magnetic Field Sweep, Journal of Magnetic Resonance, Academic Press, Orlando, FL, US Lnkd-Doi:10.1006/JMRE.1998.1385, vol. 132, No. 1, ISSN: 1090-7807, May 1, 1998, pp. 172-175, XP004407468.

F. Yamaguchi, et al., Crystal Lattice Quantum Computer, Applied Physics A, vol. 68, 1999, pp. 1-8, XP002597857.

EP Search Report for Application No. 07832835.8-2209 / 2088447 PCT/JP2007073138 dated Sep. 9, 2010.

Gammon, D., et al., "Nuclear Spectroscopy in Single Quantum Dots: Nanoscopic Raman Scattering and Nuclear Magnetic Resonance," Science, vol. 277, 1997. p. 85-p. 88.

Yusa, G., et al., "Controlled Multiple Quantum Coherences of Nuclear Spins in a Nanometre-Scale Device," Nature, vol. 434, 2005, p. 1001-p. 1005.

Wu, E., et al., "Preliminary Study of Planar RF Coils for Magnetic Resonance Microscopy," Proceedsings of the 2005 IEEE Engineering in Medicine and Biology 27th Annual Conference, 2005, vol. 2, pp. 1363-1366.

Internation Search Report dated Feb. 18, 2008 for International Application No. PCT/JP2007/073138.

International Preliminary Report, International Application No. PCT/JP2007/073138, dated Jun. 11, 2009.

* cited by examiner

Fig.2
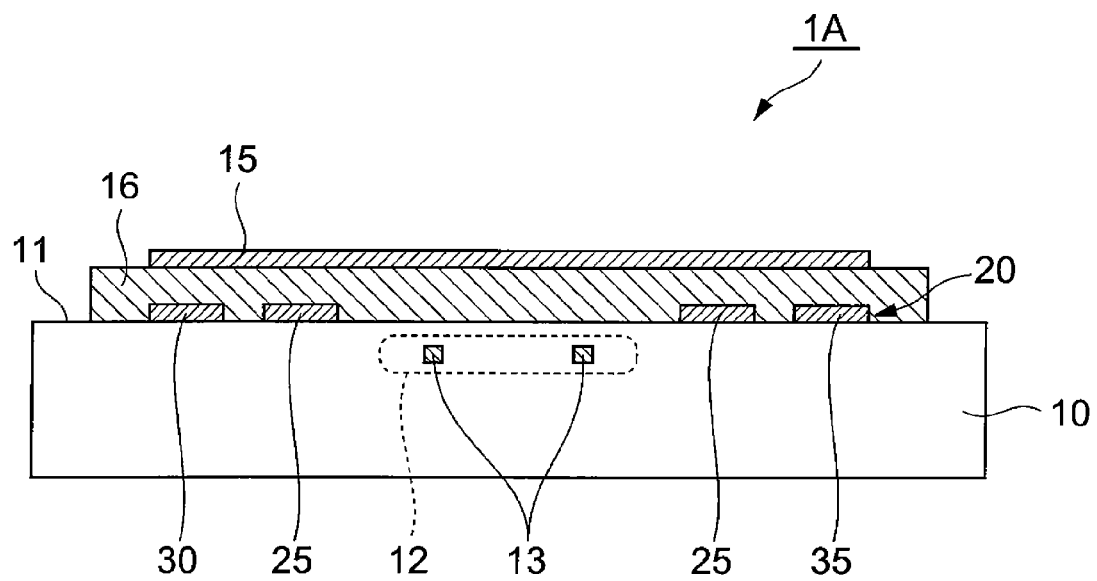
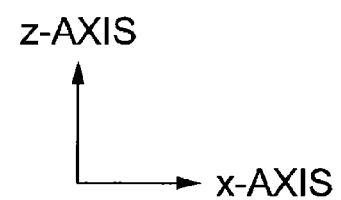

Fig.5
(a)
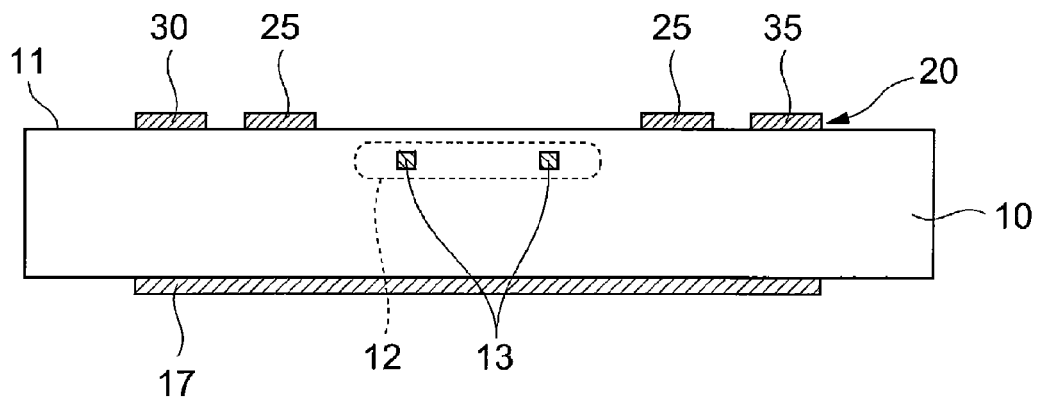
(b)
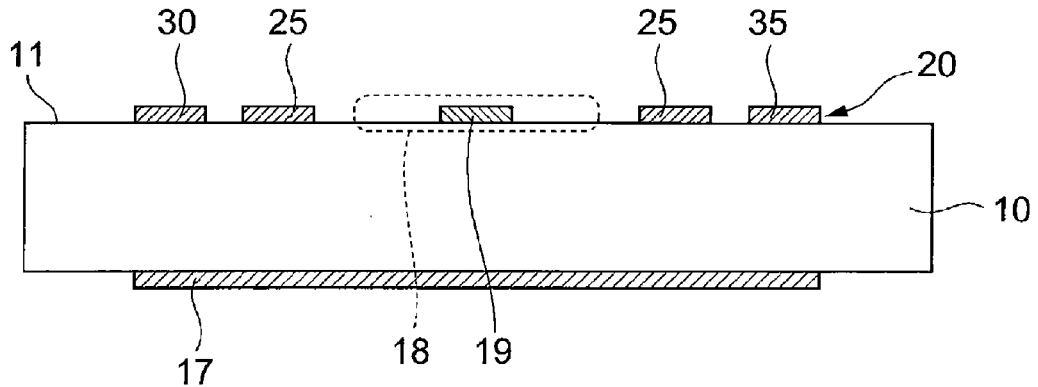

Fig.7
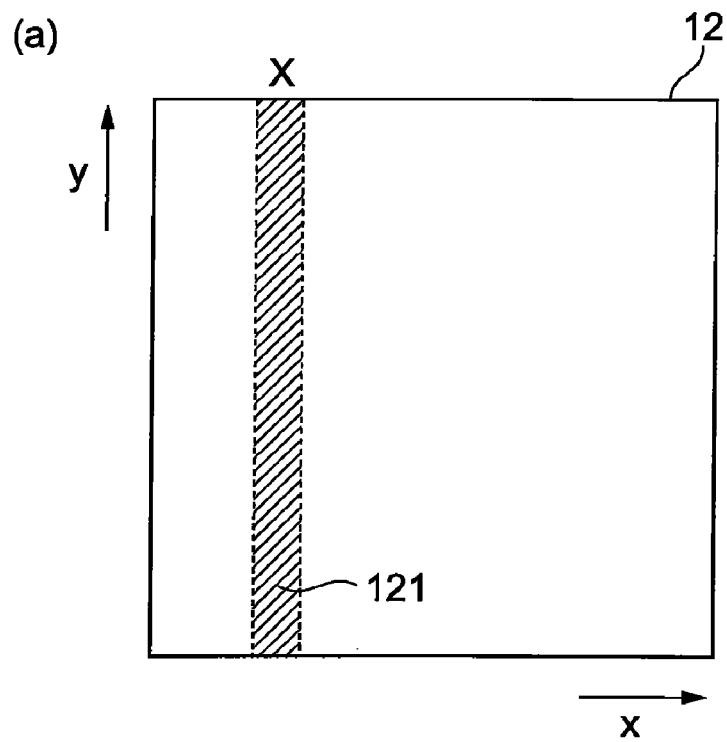
(a)
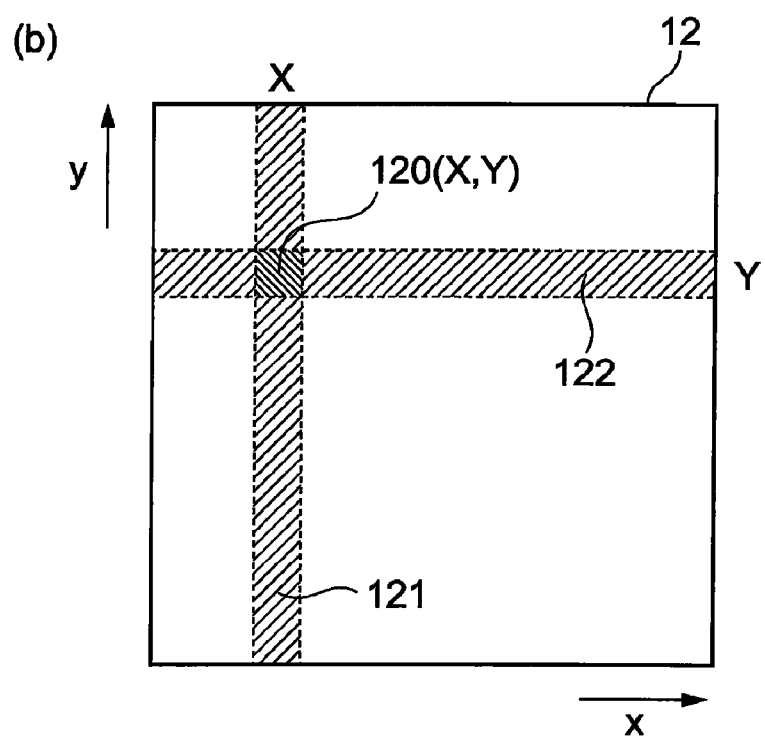
(b)

Fig.8
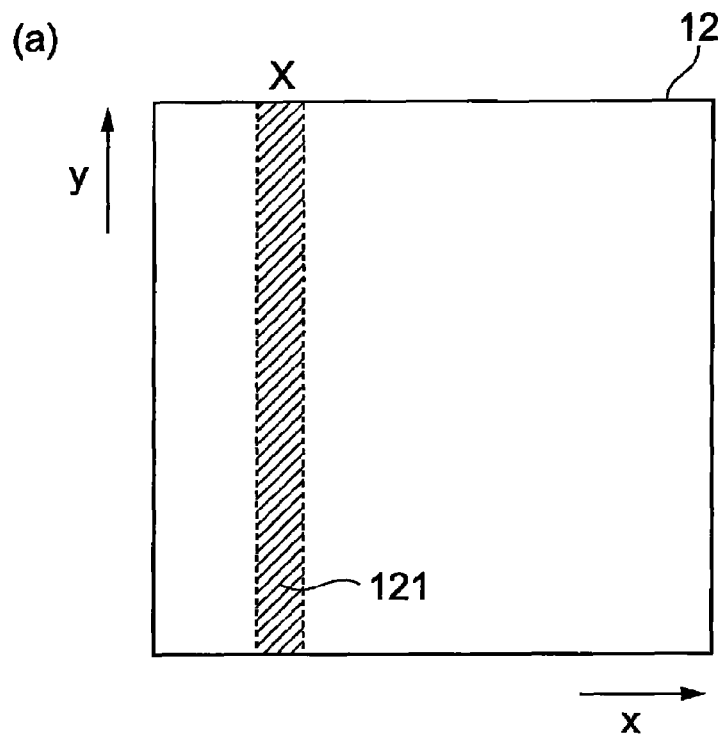
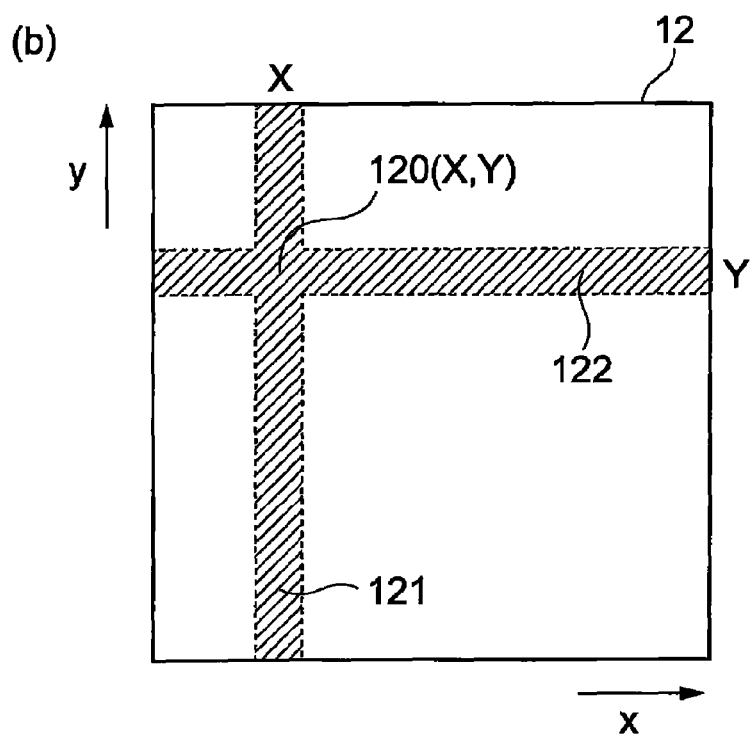

NUCLEAR MAGNETIC RESONANCE IMAGING DEVICE, AND IMAGING SYSTEM AND METHOD USING THE SAME

TECHNICAL FIELD

The present invention relates to a nuclear magnetic resonance imaging device that acquires an image of an object to be measured using nuclear magnetic resonance phenomenon, and an imaging system and an imaging method using the same.

BACKGROUND ART

The magnetic resonance imaging (MRI) method is a method of acquiring image information of the interior of a measurement object in a non-destructive manner by irradiating the measurement object placed in a magnetic field with a radio-frequency wave (RF wave) and using nuclear magnetic resonance phenomenon that occurs in the atomic nucleus within the measurement object. The MRI method uses a method of specifying the measurement position in the measurement object by applying a gradient magnetic field to the measurement object, and acquiring the image information.

In general, a magnetic resonance imaging device (MRI device) comprises an RF irradiation coil that irradiates a measurement object with an RF pulse for nuclear magnetic resonance measurement, a magnet or a coil that applies a static magnetic field and a gradient magnetic field to the measurement object, a detection coil that detects a nuclear magnetic resonance (NMR) signal from the measurement object, etc. (for example, refer to patent document 1). Such an MRI method is widely used for, for example, acquiring an image of a subject in the medical field and the like.

Patent Document 1: Japanese Patent Application Laid-Open No. 2006-158767
Patent Document 2: Japanese Patent Application Laid-Open No. 2003-329756
Patent Document 3: Japanese Patent Application Laid-Open No. 2006-66603
Patent Document 4: Japanese Patent Application Laid-Open No. 2006-135054
Patent Document 5: Japanese Patent Application Laid-Open No. 2006-204551
Non-Patent Document 1: D. Gammon et al., "Nuclear Spectroscopy in Single Quantum Dots: Nanoscopic Raman Scattering and Nuclear Magnetic Resonance", Science Vol. 277, pp. 85-88 (1997)
Non-Patent Document 2: G. Yusa et al., "Controlled Multiple Quantum Coherences of Nuclear Spins in a Nanometer-Scale Device", Nature Vol. 434, pp. 1001-1005 (2005)

DISCLOSURE OF THE INVENTION

Problems to be Solved by the Invention

The conventional nuclear magnetic resonance imaging device described above has a position resolution of, in general, about several mm in its nuclear magnetic resonance measurement. On the other hand, there can be thought a possibility of acquiring an image using the MRI method that targets a fine structure on the scale of, for example, nanometers (nm) as a measurement object. However, with the configuration of the conventional magnetic resonance imaging device, it is difficult to realize a high position resolution capable of measuring such a fine structure.

The present invention has been developed in order to solve the above problem and an object thereof is to provide a nuclear magnetic resonance imaging device capable of acquiring an image of a measurement object using a nuclear magnetic resonance imaging method with a high resolution, and an imaging system and an imaging method using the same.

Means for Solving the Problems

In order to achieve such an object, a nuclear magnetic resonance imaging (MRI) device according to the present invention comprises a substrate, a magnetic field applying electrode group provided being integrated on a measurement surface, which is one surface of the substrate, for setting a local measurement position in a measurement region of nuclear magnetic resonance set in a predetermined region with respect to the substrate by applying a magnetic field to the measurement region, and RF irradiation means provided at a predetermined position with respect to the substrate for irradiating the measurement region of the substrate with an RF pulse, wherein the magnetic field applying electrode group includes, a uniform magnetic field electrode applying a uniform magnetic field to the measurement region in accordance with the measurement position to be set, a first gradient magnetic field electrode applying a gradient magnetic field to the measurement region in a first axis direction parallel to the measurement surface of the substrate, and a second gradient magnetic field electrode applying a gradient magnetic field to the measurement region in a second axis direction parallel to the measurement surface and perpendicular to the first axis.

The above-described nuclear magnetic resonance imaging device sets the measurement region including the measurement object in the predetermined region with respect to the substrate, and is configured by integrating the magnetic field applying electrode group on the substrate. In this manner, it is possible to acquire the image information about the measurement object with a high resolution by using the device with a configuration in which electrodes for applying a magnetic field necessary for nuclear magnetic resonance measurement etc. are integrated.

Further, the electrode group used to apply a magnetic field to the measurement region is provided with the three kinds of electrode, that is, the uniform magnetic field electrode, the first gradient magnetic field electrode, and the second gradient magnetic field electrode. By using these electrodes, it is made possible to set a local measurement position in the measurement region and thereby preferably realize the acquisition of the image information about the object to be measured.

A nuclear magnetic resonance imaging system according to the present invention comprises the above-described nuclear magnetic resonance imaging device, a uniform magnetic field current source supplying a current for generating a uniform magnetic field to the uniform magnetic field electrode, a first gradient magnetic field current source supplying a current for generating a gradient magnetic field to the first gradient magnetic field electrode, a second gradient magnetic field current source supplying a current for generating a gradient magnetic field to the second gradient magnetic field electrode, RF pulse supply means supplying the RF pulse to the RF irradiation means, detection means detecting a nuclear magnetic resonance signal from a measurement object in the measurement region of the nuclear magnetic resonance imaging device, and imaging control means controlling imaging of the measurement object by means of nuclear magnetic resonance.

A nuclear magnetic resonance imaging method according to the present invention, using the above-described nuclear magnetic resonance imaging device, and comprises a current supply step of supplying a current for generating a magnetic field as needed, to each of the uniform magnetic field electrode, the first gradient magnetic field electrode, and the second gradient magnetic field electrode, an RF pulse supply step of supplying the RF pulse to the RF irradiation means, a detection step of detecting a nuclear magnetic resonance signal from a measurement object in the measurement region of the nuclear magnetic resonance imaging device, and an imaging control step of controlling imaging of the measurement object by means of nuclear magnetic resonance.

In the nuclear magnetic resonance imaging system and the nuclear magnetic resonance imaging method described above, measurement is made by supplying a current for generating a magnetic field to the three kinds of electrode constituting the electrode group from the corresponding current sources, respectively, using the imaging device with the configuration in which the electrodes for applying a magnetic field and the like are integrated on the substrate as described above. As a result, it is made possible to preferably realize the acquisition of the image information about the measurement object with a high resolution while securely controlling the local measurement position in the measurement region.

Effects of the Invention

According to the nuclear magnetic resonance imaging device, imaging system, and imaging method of the present invention, it is made possible to preferably set the local measurement position in the measurement region and acquire the image information about the measurement object with a high resolution, by integrating the magnetic field applying electrode group on the substrate on which the measurement region including the measurement object is set, and by configuring the electrode group with the three kinds of electrode, that is, the uniform magnetic field electrode, the first gradient magnetic field electrode, and the second gradient magnetic field electrode.

BRIEF DESCRIPTION OF THE DRAWINGS

FIG. 2 is a cross-sectional view illustrating a cross-sectional structure of the imaging device shown in FIG. 1.

FIG. 5 shows cross-sectional views illustrating cross-sectional structures of variations (a), (b) of the imaging device.

FIG. 7 shows schematic diagrams illustrating a method of measuring nuclear magnetic resonance in a first measurement mode.

FIG. 8 shows schematic diagrams illustrating a method of measuring nuclear magnetic resonance in a second measurement mode.

DESCRIPTION OF THE SYMBOLS

Figure 1:
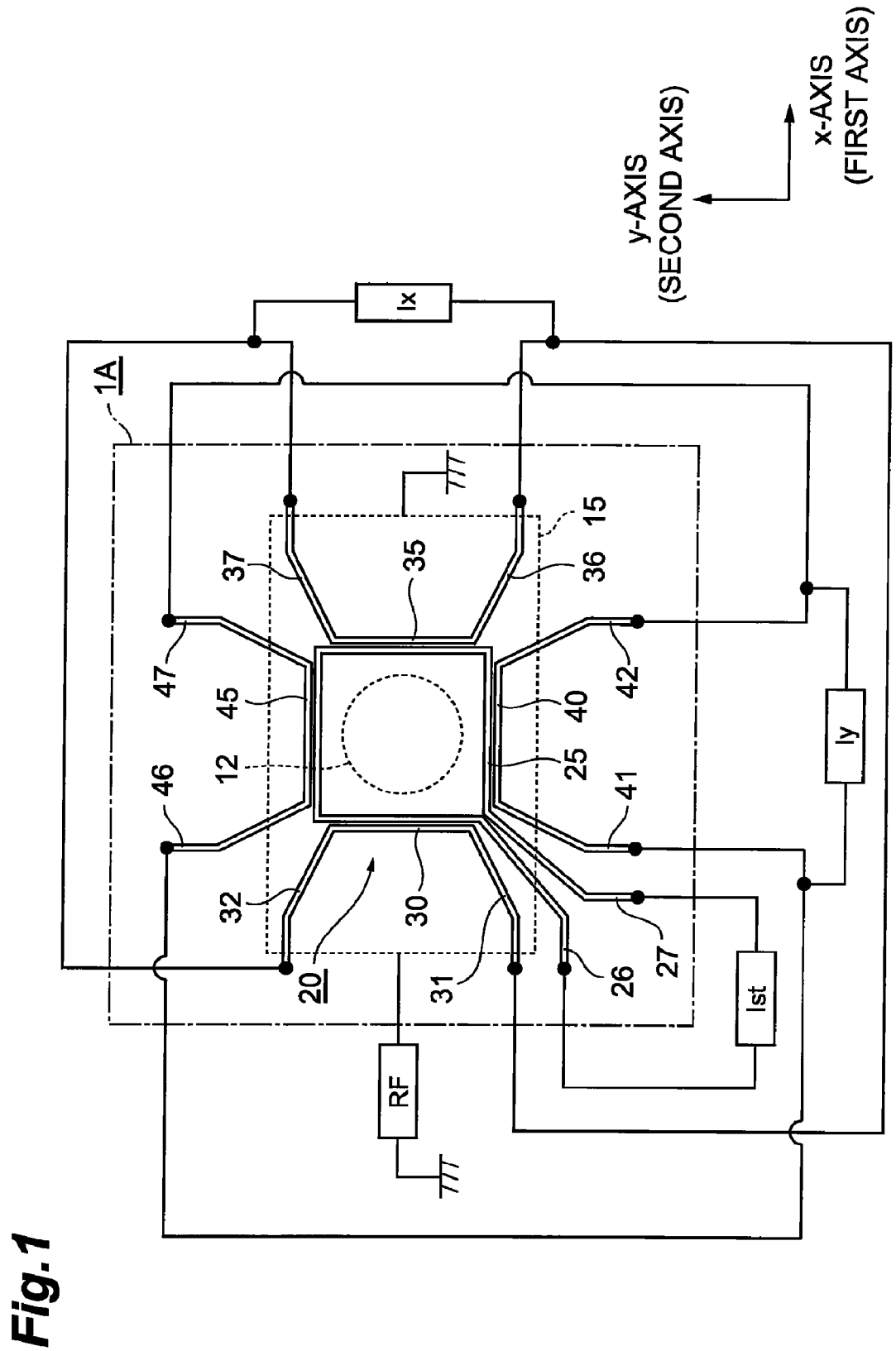
FIG. 1 is a diagram schematically illustrating a planar configuration of an embodiment of a nuclear magnetic resonance imaging device.

1A—nuclear magnetic resonance imaging device, 10—substrate, 11—measurement surface, 12—measurement region, 13—measurement object, 15—RF antenna, 16—insulating layer, 20—magnetic field applying electrode group, 25—uniform magnetic field electrode, 26, 27—wiring, 30, 35—first gradient magnetic field electrode, 31, 32, 36, 37—wiring, 40, 45—second gradient magnetic field electrode, 41, 42, 46, 47—wiring, 50—uniform magnetic field current source, 51—first gradient magnetic field current source, 52—second gradient magnetic field current source, 54—detector, 56—controller, 60—RF wave generator, 61—distributor, 62—phase adjuster, 63—first switch, 64—second switch, 65—synthersizer.

BEST MODES FOR CARRYING OUT THE INVENTION

Preferred embodiments of a nuclear magnetic resonance imaging device, imaging system, and imaging method according to the present invention will be described below in detail with reference to the drawings. In the description of the drawings, the same elements are assigned the same symbols and their duplicated explanation is omitted. The ratios of dimensions in the drawings are not necessarily the same as those in the description.

First, a configuration of the nuclear magnetic resonance imaging device according to the present invention will be described. FIG. 1 is a diagram schematically illustrating a planar configuration of an embodiment of the nuclear magnetic resonance imaging device. FIG. 2 is a cross-sectional view illustrating a cross-sectional structure of the imaging device shown in FIG. 1.

In FIG. 1, in the configuration of a nuclear magnetic resonance imaging device 1A, the configuration of a magnetic field applying electrode group 20 to be described later, the installation position (installation range) of an RF antenna 15, etc., are shown specifically and other device structures are shown schematically. In the following description, two axes parallel to a measurement surface of a substrate and perpendicular to each other are assumed to be an x-axis (first axis) and a y-axis (second axis), respectively, and an axis perpendicular to the measurement surface is assumed to be a z-axis in the planar structure in FIG. 1. FIG. 2 illustrates a cross-sectional structure in a plane that passes through the center position of the electrode group 20 in the imaging device 1A and parallel to the x-axis and the z-axis.

The nuclear magnetic resonance imaging device 1A according to the present embodiment comprises a substrate 10, the magnetic field applying electrode group 20, and the RF antenna 15. In the imaging device 1A, a measurement region 12 of nuclear magnetic resonance is set in a predetermined region with respect to the substrate 10. In the configuration shown in FIG. 2, as a specific example of the setting of the measurement region 12, a region within the substrate 10 at a predetermined depth from a measurement surface (the upper surface in FIG. 2) 11, which is one surface of the substrate 10, is set as the measurement region 12 and a measurement object 13 is arranged in the measurement region 12.

The imaging device 1A has a device structure in which the magnetic field applying electrode group 20 and the RF antenna 15 are integrated on the substrate 10, as shown in FIG. 2. The magnetic field applying electrode group 20 comprises a plurality of electrodes integrated and provided on the measurement surface 11 of the substrate 10 and is used to set a local measurement position in the measurement region 12 by applying a magnetic field necessary for nuclear magnetic resonance measurement to the measurement region 12. The electrode group 20 is formed into an electrode pattern substantially symmetric in the x-axis direction and in the y-axis direction when viewed from the region 12 so as to surround the measurement region 12 on the measurement surface 11.

Specifically, the magnetic field applying electrode group 20 comprises three kinds of electrodes, that is, a uniform magnetic field electrode 25, first gradient magnetic field electrodes 30, 35, and second gradient magnetic field electrodes 40, 45. The uniform magnetic field electrode 25 is an electrode that applies a uniform magnetic field in accordance with a measurement position to be set to the measurement region 12, and comprises a rectangular loop electrode formed so as to surround the measurement region 12. The loop electrode 25 constitutes a one-turn coil starting from the bottom-left portion in FIG. 1 and wirings 26, 27 for supplying a current are provided respectively at both ends thereof.

The imaging device 1A has a configuration in which a measurement position can be set at a desired position in the region 12 by controlling the magnitude of a uniform magnetic field applied to the measurement region 12 by the electrode 25. For example, it is possible to scan a measurement position in the x-axis direction or in the y-axis direction in the region 12 by changing the magnitude of the uniform magnetic field by the electrode 25. For the application of a uniform magnetic field to the measurement region 12, in addition to the uniform magnetic field electrode 25 integrated on the substrate 10 and used to control the measurement position, a normal static magnetic field applying device 22 (refer to FIG. 3), by magnet, coil, and the like is also used together.

The first gradient magnetic field electrodes 30, 35 are electrodes for applying a gradient magnetic field in the x-axis direction, which is the first axis parallel to the measurement surface 11 of the substrate 10, to the measurement region 12, and comprises a pair of first split electrodes formed so as to sandwich the measurement region 12 in the x-axis direction. The split electrode 30 is located on the left-hand side when viewed from the region 12 in FIG. 1 (the negative side of the x-axis) and formed into a straight electrode pattern extending along the y-axis outside the left side of the electrode 25, and wirings 31, 32 for supplying a current are provided respectively at both ends thereof. The split electrode 35 is located on the right-hand side when viewed from the region 12 (the positive side of the x-axis) and formed into a straight electrode pattern extending also along the y-axis outside the right side of the electrode 25, and wirings 36, 37 for supplying a current are provided respectively at both ends thereof.

The second gradient magnetic field electrodes 40, 45 are electrodes for applying a gradient magnetic field in the y-axis direction, which is the second axis parallel to the measurement surface 11 of the substrate 10, to the measurement region 12, and comprises a pair of second split electrodes formed so as to sandwich the measurement region 12 in the y-axis direction. The split electrode 40 is located on the lower side when viewed from the region 12 in FIG. 1 (the negative side of the y-axis) and formed into a straight electrode pattern extending along the x-axis outside the bottom side of the electrode 25, and wirings 41, 42 for supplying a current are provided respectively at both ends thereof. The split electrode 45 is located on the upper side when viewed from the region 12 (the positive side of the y-axis) and formed into a straight electrode pattern extending also along the x-axis outside the top side of the electrode 25, and wirings 46, 47 for supplying a current are provided respectively at both ends thereof.

For the electrode group 20 comprising each of these electrodes, the RF antenna 15 is provided at a predetermined position with respect to the substrate 10. The RF antenna 15 is RF irradiation means that irradiates the measurement region 12 in the substrate 10 with an RF pulse for measuring nuclear magnetic resonance that occurs in the atomic nucleus in the measurement object 13. In the present embodiment, as shown in FIG. 2, on the measurement surface 11 of the substrate 10, an insulating layer 16 that covers the electrode group 20 is provided and on the insulating layer 16, the RF antenna 15 is formed. With this arrangement, the RF antenna 15 is integrated on the measurement surface 11 of the substrate 10 in a state of being insulated from the electrode group 20 by the insulating layer 16.

Figure 3:
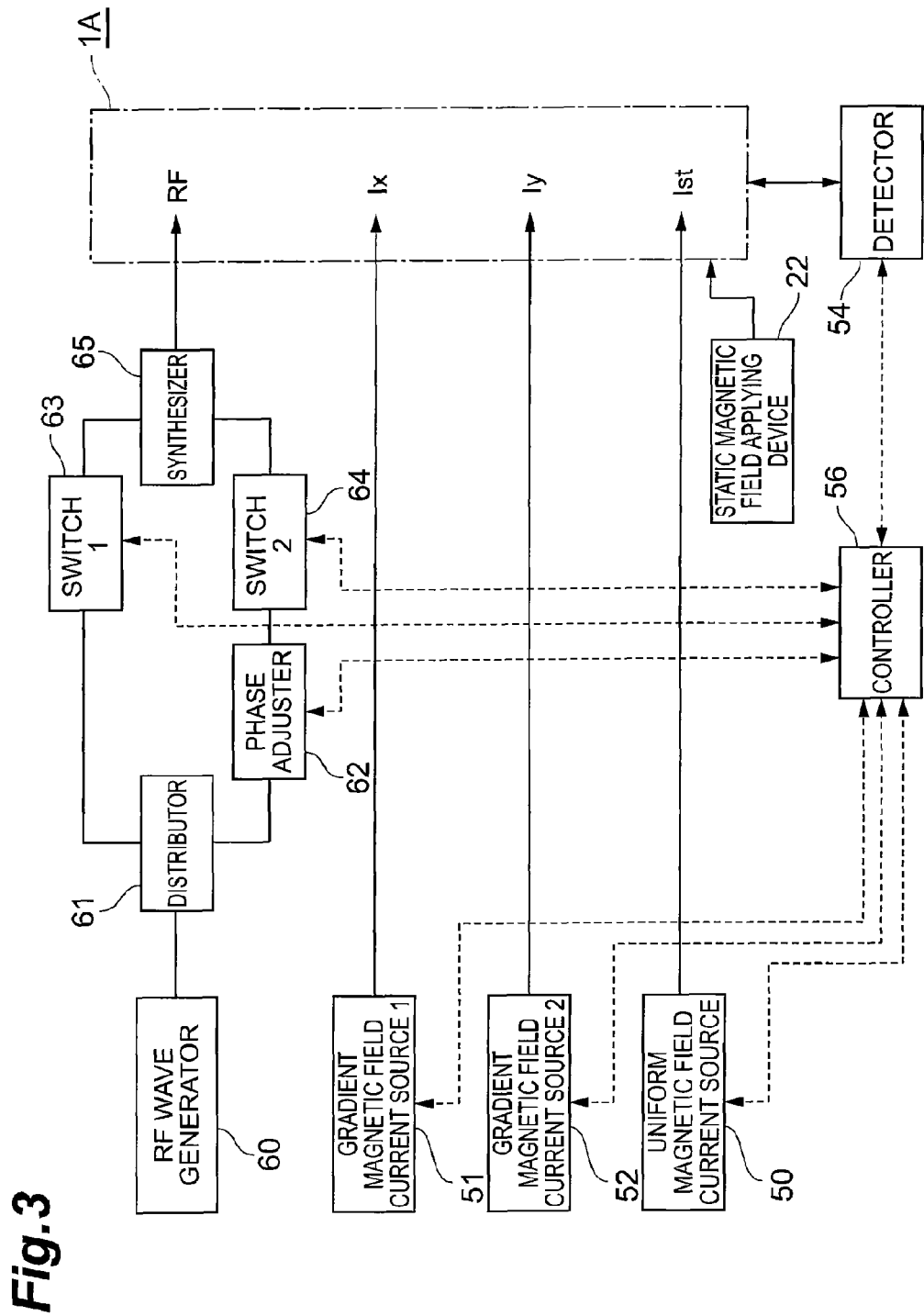
FIG. 3 is a block diagram illustrating a configuration of an embodiment of a nuclear magnetic resonance imaging system.

Next, a nuclear magnetic resonance imaging system according to the present invention, which uses the above-described imaging device 1A, will be described. FIG. 3 is a block diagram illustrating a configuration of an embodiment of the nuclear magnetic resonance imaging system. The imaging system according to the present embodiment comprises the nuclear magnetic resonance imaging device 1A, a uniform magnetic field current source 50, gradient magnetic field current sources 51, 52, an RF wave generator 60, a detector 54, and a controller 56. Among these, the configuration of the imaging device 1A is the same as that described above with respect to FIG. 1 and FIG. 2.

The uniform magnetic field current source 50 is a current source for supplying a current Ist for generating a uniform magnetic field to the electrode 25 of the imaging device 1A and is connected between the wirings 26, 27 as shown in FIG. 1. The first gradient magnetic field current source 51 is a current source for supplying a current Ix for generating a gradient magnetic field in the x-axis direction to the electrodes 30, 35 and is connected between the wirings 31, 32 and between the wirings 36, 37. The second gradient magnetic field current source 52 is a current source for supplying a current Iy for generating a gradient magnetic field in the y-axis direction to the electrodes 40, 45 and is connected between the wirings 41, 42 and between the wirings 46, 47. As these current sources 50, 51 and 52, for example, a direct current source having a high-speed switch with a rise time on the scale of nanosecond is used preferably.

The RF wave generator 60 constitutes RF pulse supply means that supplies an RF pulse to the RF antenna 15 of the imaging device 1A along with a distributor 61, a phase adjuster 62, a first switch 63, a second switch 64, and a synthesizer 65. The RF pulse from the RF pulse supply means to the RF antenna 15 is supplied as a single RF pulse or an RF pulse string including a plurality of RF pulses in accordance with the content of specific measurement.

Specifically, the RF wave output from the RF wave generator 60 is equally distributed by the distributor 61. Then, one of the distributed RF waves is input to the synthesizer 65 via the switch 63. The other RF wave is input to the synthesizer 65 via the switch 64 after its phase is adjusted by the phase adjuster 62. Then, the RF wave synthesized by the synthesizer 65 is supplied to the RF antenna 15 of the imaging device 1A as an RF pulse for nuclear magnetic resonance measurement.

In such a configuration, it is possible to control the RF pulse to be supplied to the RF antenna 15 of the imaging device 1A by controlling ON/OFF of the RF wave output from the generator 60 and the operation of the phase adjustor 62 and the switches 63, 64. FIG. 3 shows an example of a specific configuration of the RF pulse supply means and a variety of configurations may be used other than this.

The detector 54 is detection means that detects a nuclear magnetic resonance signal from the measurement object 13 in the measurement region 12 in the imaging device 1A. The detector 54 detects a nuclear magnetic resonance signal, which is generated by irradiating the measurement region 12 with the RF pulse from the RF antenna 15 in a state where a predetermined magnetic field including the static magnetic field by the static magnetic field applying device 22 and the magnetic field by the magnetic field applying electrode group 20 is applied to the measurement region 12, in an optical or electrical manner and takes it to outside. By acquiring such a nuclear magnetic resonance signal while changing the application conditions of magnetic field to the measurement region 12 and the irradiation conditions of RF pulse, it is possible to acquire two-dimensional image information about the measurement object 13 in the measurement region 12.

The controller 56 is provided for these current sources 50, 51, 52, the RF pulse supply means including the RF wave generator 60, and the detector 54. The controller 56 is imaging control means that controls the imaging of the measurement object 13 placed in the measurement region 12 in the imaging device 1A by means of nuclear magnetic resonance. The imaging control method by the controller 56 will be described below specifically.

The effects of the nuclear magnetic resonance imaging device and the imaging system according to the present embodiment will be described.

The imaging device 1A shown in FIG. 1 and FIG. 2 sets the measurement region 12 including the measurement object 13 in a predetermined region with respect to the substrate 10 constituting the device 1A, and at the same time, is configured by integrating the magnetic field applying electrode group 20 and the like on the substrate 10. It is possible to acquire image information on the measurement object 13 with a high resolution by using the device having the configuration in which the electrodes for applying a magnetic field necessary for nuclear magnetic resonance measurement and the like are integrated as described above.

In addition, as the electrode group 20 used to apply a magnetic field to the measurement region 12, the three kinds of electrode are provided: the uniform magnetic field electrode 25, the first gradient magnetic field electrodes 30, 35, and the second gradient magnetic field electrodes 40, 45. By using these electrodes in combination, it is made possible to preferably realize the setting and control of a local measurement position in the measurement region 12, the change and scanning of the measurement position, and thereby the acquisition of image information on the measurement object 13.

In the imaging system shown in FIG. 3, measurement is made by, as described above, using the imaging device 1A having a configuration in which the electrodes for applying a magnetic field etc. are integrated on the substrate 10, and by supplying a current for generating a magnetic field from the respective corresponding current sources to the respective three kinds of electrode constituting the electrode group 20. With this arrangement, it is made possible to preferably realize the acquisition of image information about the measurement object 13 with a high resolution while securely controlling a local measurement position in the measurement region 12.

In the configuration example shown in FIG. 1, as a specific configuration of each electrode of the electrode group 20 for the application of a magnetic field to the measurement region 12, the electrode group 20 is configured by the loop electrode 25, the pair of first split electrodes 30, 35, and the pair of second split electrodes 40, 45. With such an electrode pattern, it is possible to realize the application of the uniform magnetic field for measurement position setting, the gradient magnetic field in the x-axis direction, and the gradient magnetic field in the y-axis direction to the measurement region 12 with a simple electrode configuration in which the electrodes can be preferably integrated on the substrate 10.

Figure 4:
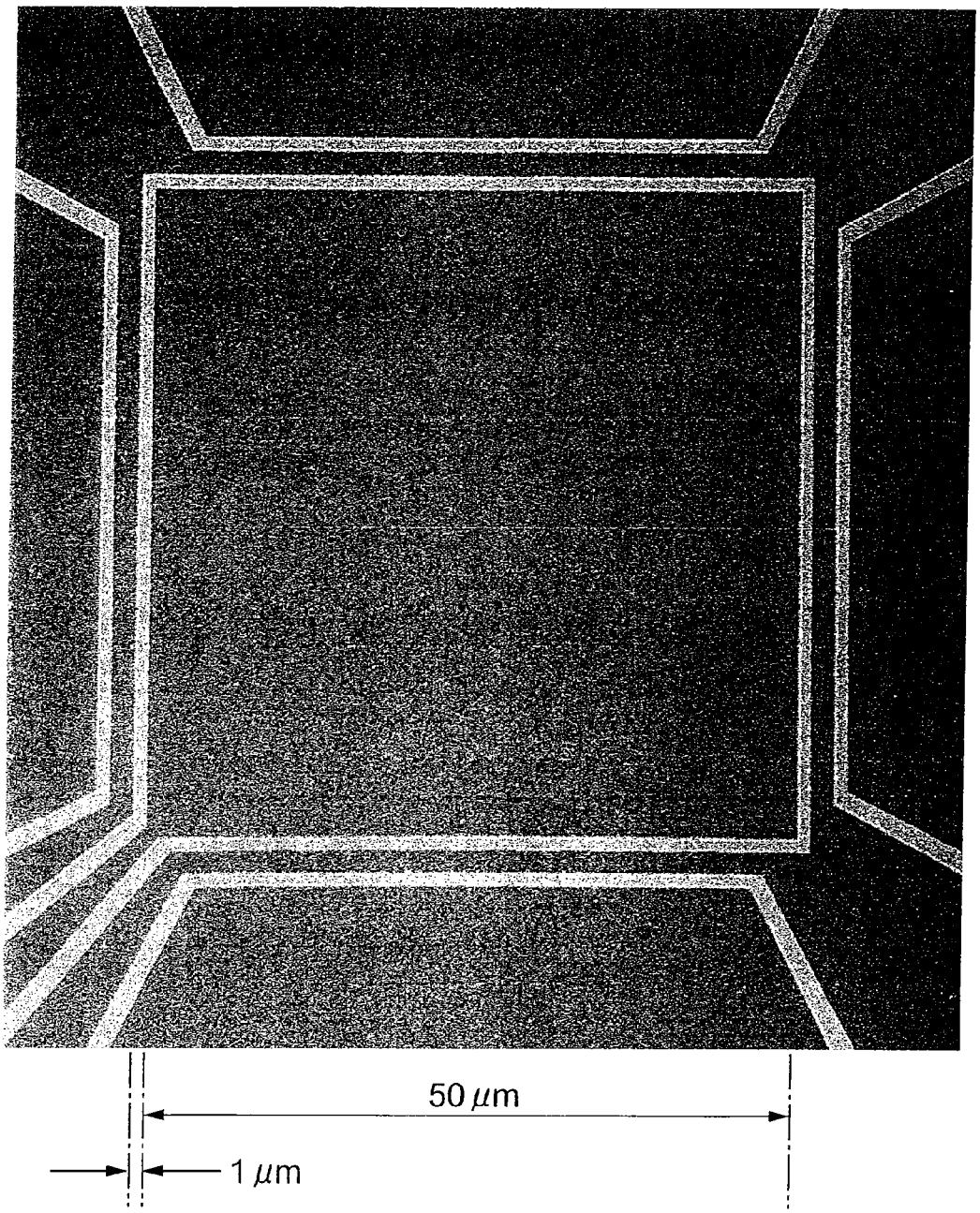
FIG. 4 is an electron microscope photograph showing a manufacture example of an electrode pattern in the imaging device.

FIG. 4 is an electron microscope photograph showing a manufacture example of an electrode pattern in the imaging device 1A having the electrode group 20 with the configuration shown in FIG. 1. Here, a GaAs semiconductor substrate having a thickness of 0.5 mm is used as the substrate 10 that serves as a base of the device 1A and each electrode pattern of the electrode group 20 is formed by gold. In this manufacture example, the gold electrode pattern is formed on the substrate via titanium having a thickness of 20 nm. The titanium layer is used to enhance close adhesion between the substrate and gold and it may be omitted if not necessary. In the electrode pattern, the inner width of the loop shape (interval between electrodes) of the uniform magnetic field electrode 25 is set to 50 μm and the pattern width of each electrode to 1 μm. From FIG. 4, it can be seen that an excellent electrode pattern of the electrode group 20 with the configuration shown in FIG. 1 is obtained. Other various configurations may be used for a specific electrode configuration of the electrode group 20.

In general, as the substrate 10 constituting the imaging device 1A, it is possible to preferably use a substrate of a material the surface of which is sufficiently flat, such as the GaAs substrate described above. As each electrode of the electrode group 20, it is preferable to use a metal that can be evaporated and an electrode pattern of a material, for example, gold, aluminum, titanium, etc., can be used. Alternatively, an electrode pattern of a superconductive material may be used when measurement is made at a temperature of a superconductive transition temperature or lower.

In the electrode pattern constituting the magnetic field applying electrode group 20, it is preferable to set the pattern width of each electrode constituting the electrode group 20 so as to fall within the range of 10 nm to 10 μm. The pattern width 1 μm described above satisfies this condition. Further, it is also preferable to set the thickness of each electrode constituting the electrode group 20 so as to fall within the range of 200 nm to 1 μm. By using an electrode pattern that satisfies such a condition, it is possible to preferably configure the magnetic field applying electrode group 20 for setting a local measurement position in the measurement region 12.

As to the size of the electrode pattern constituting the magnetic field applying electrode group 20, it is preferable to set the inner width of the electrode pattern, that is, the inner width of the loop shape of the uniform magnetic field electrode 25 in the configuration shown in FIG. 1, so as to fall within the range of 100 nm to 100 μm. The width 50 μm described above satisfies this condition. Similarly, it is preferable to set the length of each side of the loop electrode 25 and the respective lengths of the split electrodes 30, 35, 40 and 45 so as to fall within the range of 100 nm to 100 μm.

Various configurations other than the structure shown in FIG. 2 can be used for the cross-sectional structure of the imaging device 1A. FIG. 5 shows cross-sectional views illustrating the cross-sectional structures of variations (a), (b) of the imaging device shown in FIG. 1 and FIG. 2.

The variation (a) in FIG. 5 has a configuration different from that shown in FIG. 2 in that an RF antenna 17 which irradiates the measurement region 12 with the RF pulse is formed on the opposite surface of the measurement surface 11 of the substrate 10, that is, on the opposite surface of the electrode group 20 with respect to the substrate 10. In this manner, the installation position of the RF antenna may be changed as the need arises, such as in a configuration in which it is integrated on the measurement surface 11 of the substrate or on the opposite surface of the measurement surface 11.

In general, the RF irradiation means such as an RF antenna is provided at a predetermined position where irradiation of the measurement region 12 with the RF pulse is possible with respect to the substrate 10 on which the electrode group 20 is integrated on the measurement surface 11. As to the size of the RF antennas 15, 17, it is preferable to set the width of the RF antenna so as to fall within the range of 200 nm to 300 μm. In addition, it is preferable for the RF antenna to be positioned over or beneath the measurement object as described above so that the RF electromagnetic wave can be irradiated perpendicular with respect to the applied static magnetic field.

The variation (b) in FIG. 5 differs from the configuration example in FIG. 2 and the variation (a) in FIG. 5 in the setting of the measurement region with respect to the substrate 10. That is, in the variation (b), as another example of the setting of the measurement region, the region on the measurement surface 11 of the substrate 10 is set as a measurement region 18 and a measurement object 19 is placed in the measurement region 18. In this manner, as to the measurement region and the measurement object, the measurement region may be set as the need arises in accordance with the type etc. of a specific measurement object, such as a region on the measurement surface 11 of the substrate 10 or a region within the substrate 10 at a predetermined depth from the measurement surface 11.

For example, as in the configuration example in FIG. 2 and in the variation (a) in FIG. 5, in a configuration in which the measurement object 13 is placed within the substrate 10 at a predetermined depth from the measurement surface 11 of the substrate 10, the measurement object 13 is placed being embedded in advance within the substrate 10. Specific examples of the measurement object 13 as described above include, for example, a quantum dot and quantum bit. Namely, it is possible to utilize an imaging device with such a configuration for reading quantum bits used in a quantum computer etc. In this case, it is preferable to set the depth of the quantum bit within the substrate 10 so as to fall, for example, within a range of about hundreds of nanometers to several microns from the measurement surface 11.

Further, as in the variation (b) in FIG. 5, in a configuration in which the measurement object 19 is placed on the measurement surface 11 of the substrate 10, the measurement object 19 may be placed in advance on the substrate 10 or a configuration in which the measurement object 19 is placed and replaced on the substrate 10 in accordance with the need may be accepted.

Examples of a measurement object by the above-described nuclear magnetic resonance imaging device include an object made of a semiconductor material and having a size of about 10 nm to 100 μm. In addition, examples of the frequency of an RF pulse irradiated to the measurement region by the RF irradiation means such as an RF antenna, include a frequency in the range of 10 MHz to 2 GHz. The value of a static magnetic field (uniform magnetic field) to be applied to the measurement region is, for example, about 0.1 T to 10 T (tesla). The range of the value of the gradient magnetic field is, for example, about 10 μT to 1 T. The intensity of RF is, for example, about 10 μT to 100 mT.

In the present invention, "imaging" by means of nuclear magnetic resonance is not limited to, for example, an example of image acquisition carried out using an MRI apparatus in the medical field. For example, when a plurality of quantum bits by the nuclear spin in a nano-region is arranged in a measurement region, a case of locally detecting individual quantum bits while controlling the measurement position is included in "imaging", that is, image acquisition of the measurement region 12. In general, it is only required that detection of local information be possible by a nuclear magnetic resonance signal while identifying and controlling the measurement position in a set measurement region.

As a nuclear spin detection method used in the detector 54 (refer to FIG. 3) that detects a nuclear magnetic resonance signal from the measurement object 13 in the measurement region 12, a method of detecting a nuclear magnetic resonance signal using, for example, an optical method or electrical method can be used as described above. Alternatively, a method of detecting a nuclear magnetic resonance signal using another method may also be used.

The method of optically detecting a nuclear magnetic resonance signal can be preferably used, for example, in such a structure of the variations (a), (b) shown in FIG. 5. An example of such an optical detection method will be described (for example, refer to non-patent document "D. Gammon et al., 'Nuclear Spectroscopy in Single Quantum Dots: Nanoscopic Raman Scattering and Nuclear Magnetic Resonance', Science Vol. 277, pp. 85-88 (1997)"). This method, first, irradiates a measurement object with circularly polarized light and thereby polarizes the nuclear spin in the atomic nucleus of the object. Then, by utilizing the shift in light emission energy of the quantum dot due to the degree of the polarization of the nuclear spin, the method detects the amount of shift in energy as a nuclear magnetic resonance signal when the state of the nuclear spin is changed by the irradiation of the RF pulse.

On the other hand, the method of electrically detecting a nuclear magnetic resonance signal can be preferably used, for example, in such a structure shown in the configuration example in FIG. 2 and in the variation (a) in FIG. 5. An example of such an electrical detection method will be described (for example, refer to non-patent document "G. Yusa et al., 'Controlled Multiple Quantum Coherences of Nuclear Spins in a Nanometer-Scale Device', Nature Vol. 434, pp. 1001-1005 (2005)"). This method, first, polarizes the nuclear spin in the atomic nucleus in the object by flowing a spin-polarized current through a nano-region. Then, by utilizing the change of the electrical resistance of the object when the nuclear spin is polarized, the method detects the electrical resistance as a nuclear magnetic resonance signal when generating a superposition state of the nuclear spin by the irradiation of the RF pulse.

The configuration of the nuclear magnetic resonance imaging device 1A and the imaging system shown in FIG. 1 to FIG. 3 will be further described along with the nuclear magnetic resonance imaging method according to the present invention. The imaging device and the imaging system according to the present invention, as described above, acquire a nuclear magnetic resonance signal by the detector 54 while changing the application condition of magnetic field to the measurement region 12 and the irradiation condition of RF pulse, and thereby acquire the two-dimensional image information on the measurement region 12. Further, the application condition of magnetic field to the measurement region 12 and the irradiation condition of RF pulse as described above are controlled by the controller 56, which is the imaging control means configured by using, for example, a personal computer (refer to FIG. 3). Here, the pulse width, intensity, pulse synchronization, etc., of the current pulse to be supplied to each electrode of the electrode group 20 and the RF pulse to be irradiated to the measurement region 12 are controlled by the controller 56. Further, the nuclear magnetic resonance signal acquired by the detector 54 is input to the controller 56, and the necessary processing such as imaging processing or quantum bit reading processing is performed in the controller 56.

It is preferable for such a configuration that the controller 56 select the axis direction in which the measurement position is set by controlling supply of a current to the first gradient magnetic field electrodes 30, 35, or to the second gradient magnetic field electrodes 40, 45, and thereby controlling the gradient magnetic field applied to the measurement region 12, and scan the measurement position in the region 12 by controlling supply of a current to the uniform magnetic field electrode 25, and thereby controlling the uniform magnetic field applied to the measurement region 12.

As described above, it is possible to preferably realize the setting of the measurement position in the region 12, the change and scanning thereof, by selecting the axis direction (x-axis direction or y-axis direction) in which the measurement position is set by applying the gradient magnetic field using the first gradient magnetic field electrodes 30, 35, or the second gradient magnetic field electrodes 40, 45 and at the same time, by controlling the setting or change of the magnitude of the uniform magnetic field to be applied to the measurement region 12 by the uniform magnetic field electrode 25. In addition, in such a configuration, it is possible to scan a resonance position, which will turn into a measurement position by changing the current value to be supplied to each electrode.

It is preferable for the controller 56 to image the measurement object 13 by means of nuclear magnetic resonance using a measurement period including (1) a first period during which the measurement region 12 is irradiated with the RF pulse in a state where the measurement position is selected being applied with the gradient magnetic field in the first axis direction, with the supply of a current to the first gradient magnetic field electrodes 30, 35 turned ON and the supply of a current to the second gradient magnetic field electrodes 40, 45 turned OFF; and (2) a second period during which the measurement region 12 is irradiated with the RF pulse in a state where the measurement position is selected being applied with the gradient magnetic field in the second axis direction, with the supply of a current to the second gradient magnetic field electrodes 40, 45 turned ON and the supply of a current to the first gradient magnetic field electrodes 30, 35 turned OFF.

In such a configuration, measurement is made in a state where the measurement position (x coordinate) is selected in the first axis (x-axis) direction in the first period and measurement is made in a state where the measurement position (y coordinate) is selected in the second axis (y-axis) direction in the second period, and with both the measurements being combined, it is made possible to acquire information about the measurement object 13 in a state where the measurement position (x, y) is selected in both of the first axis and the second axis directions.

It is preferable for the controller 56 to use, for a measurement mode during the measurement period, two kinds of measurement mode, including (1) a first measurement mode in which a 90° pulse of a predetermined phase is used as a first RF pulse in the first period, and a 90° pulse of the same phase as that in the first period is used as a second RF pulse in the second period, and (2) a second measurement mode in which a 90° pulse of a predetermined phase is used as a first RF pulse in the first period, and a 90° pulse of a phase different (preferably, 90° different) from that in the first period is used as a second RF pulse in the second period.

In such a configuration, in the nuclear magnetic resonance measurement during the measurement period including the first period and the second period described above, the nuclear magnetic resonance signal is detected respectively in the two kinds of measurement mode in which the irradiation conditions of RF pulse to the measurement region 12 are different, and with both the detection results being combined, it is made possible to securely acquire local information on the set measurement position (x, y).

Figure 6:
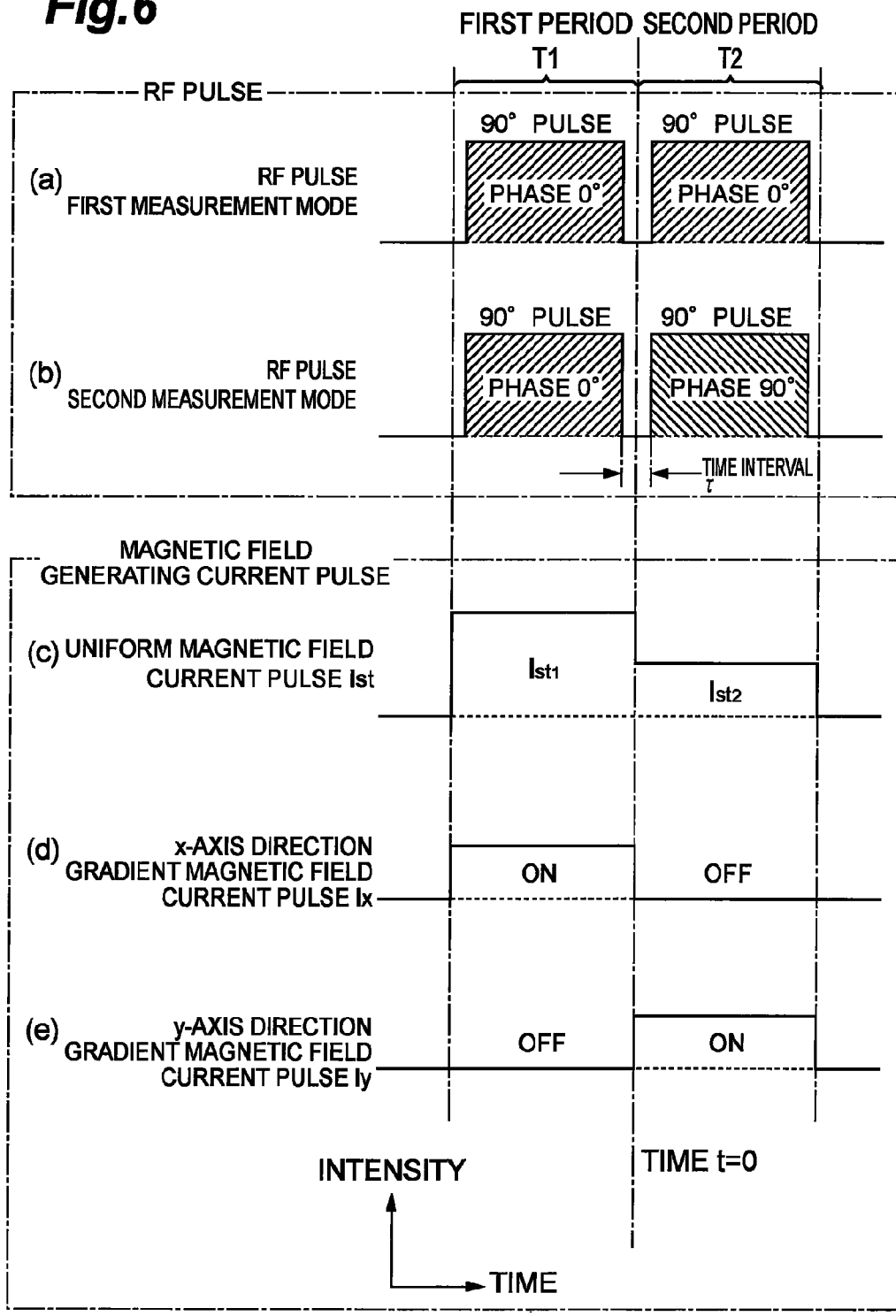
FIG. 6 is a timing chart showing an RF pulse with which a measurement region is irradiated and current pulses to be supplied to a magnetic field applying electrode group.

Such a nuclear magnetic resonance imaging method will be described specifically with reference to FIG. 6 to FIG. 8. FIG. 6 is a timing chart showing the RF pulse with which the measurement region 12 is irradiated and the current pulses to be supplied to the magnetic field applying electrode group 20. FIG. 7 is a schematic diagram illustrating the method of measuring nuclear magnetic resonance in the first measurement mode. FIG. 8 is a schematic diagram illustrating the method of measuring nuclear magnetic resonance in the second measurement mode.

Charts (a), (b) in FIG. 6 are timing charts, respectively, showing the RF pulse with which the measurement region 12 is irradiated from the RF antenna 15, wherein the chart (a) shows the RF pulses to be irradiated in the first measurement mode and the chart (b) shows the RF pulses to be irradiated in the second measurement mode.

Further, charts (c), (d), (e) are timing charts, respectively, showing the current pulse to be supplied to each electrode for generating a magnetic field to be applied to the measurement region 12 from the electrode group 20, wherein the chart (c) shows the current pulse Ist to be supplied to the uniform magnetic field electrode 25, the chart (d) shows the current pulse Ix to be supplied to the first gradient magnetic field electrodes 30, 35 for the x-axis direction, and the chart (e) shows the current pulse Iy to be supplied to the second gradient magnetic field electrodes 40, 45 for the y-axis direction.

The imaging method in the embodiment shown in FIG. 6 adopts a method that images the measurement object 13 by means of nuclear magnetic resonance using the measurement period including the first period and the second period as described above. In correspondence to this, in the charts (a) to (e) in FIG. 6, the central time of the measurement period is set to t=0, and the period before this time t=0 is set as a first period T1 and the period after the time is set as a second period T2. The length of the periods T1 and T2 is substantially the same.

In such a measurement period, the irradiation of RF pulse to the measurement region 12 is carried out in such a manner that two RF pulses are used for irradiation, that is, the first RF pulse is used in the first period T1 and the second RF pulse is used in the second period T2 as shown in the charts (a), (b) in FIG. 6. A time interval $\tau$ ($\tau$>0) between the first and second RF pulses is set to a time interval sufficiently short compared to the coherent time of the nuclear spin in the measurement object 13. Due to such a setting, when the nuclear spin changes from the initial state into an intermediate state and an inversion state, as described later, the period of time of the intermediate state is a time during which the coherent state of the nuclear spin is held. Here, as describe above, because the central time of the measurement period, which is the central time between the first period T1 and the second period T2, is set to the time t=0, the end time of the first RF pulse is t=$-\tau/2$ and the start time of the second RF pulse is t=$\tau/2$.

In the present embodiment, for these first and second RF pulses, the two kinds of measurement mode are used in the measurement period. In each measurement mode, a 90° pulse is used as an RF pulse with which the measurement region 12 is irradiated. It is preferable to fix the frequency of 90° pulse to a frequency that resonates with the nuclear spin of an atomic nucleus constituting the measurement object 13 under the condition of, for example, a magnetic field B0 applied from the static magnetic field applying device 22.

Specifically, in the first measurement mode, as shown in the chart (a), the RF pulse used in the first period T1 is a 90° pulse of a predetermined phase (phase 0°). The RF pulse used in the second period T2 is a 90° pulse of the same phase (phase 0°) as that in the first period. In the second measurement mode, as shown in the chart (b), the RF pulse used in the first period T1 is a 90° pulse of the predetermined phase (phase 0°) same as that in the first measurement mode. The RF pulse used in the second period T2 is a 90° pulse of a phase (phase 90°) 90° different from that in the first period.

The phases of these RF pulses can be controlled by controlling the operation of the phase adjuster 62 in the configuration shown in FIG. 3. In the first and second measurement modes, the condition is different only for the phase of the second RF pulse and the conditions for the time interval τ of the first and second RF pulses, the intensity of the RF pulses, etc., are the same.

The magnetic field generating current pulses for generating a magnetic field (local magnetic field) to be applied to the measurement region 12 by the electrode group 20 integrated on the substrate 10, include the three kinds of current pulse as described above in relation to FIG. 3, that is, the current pulse Ist to be supplied to the electrode 25 from the current source 50, the current pulse Ix to be supplied to the electrodes 30, 35 from the current source 51, and the current pulse Iy to be supplied to the electrodes 40, 45 from the current source 52.

The current pulse Ist is one for generating a uniform magnetic field Bst. The current pulse Ix is one for generating the gradient magnetic field (magnetic field gradient) in the x-axis direction. The current pulse Iy is one for generating the gradient magnetic field (magnetic field gradient) in the y-axis direction. In the timing chart in FIG. 6, these current pulses Ist, Ix and Iy are shown in the charts (c), (d) and (e), respectively. Each of the current pulse supply time widths in the first period T1 and the second period T2 is set to one somewhat longer than the RF 90° pulse irradiation time width as shown in FIG. 6.

In the first period T1 (t<0) in the first half of one-time measurement period, the current pulse Ix for the x-axis direction is turned ON and the current pulse Iy for the y-axis direction is turned OFF. Due to this, the gradient magnetic field is generated in the x-axis direction in the measurement region 12 and a state is brought about where a measurement position x in the x-axis direction can be selected. In response to this, in the first period T1, the current pulse Ist of the uniform magnetic field for measurement position setting is supplied at a current value Ist1 corresponding to a measurement position X desired to be set. Due to this, in the first period T1, the measurement of nuclear magnetic resonance is made in a state where the measurement position X has been selected in the x-axis direction.

In the second period T2 (t>0) in the last half, the current pulse Iy for the y-axis direction is turned ON and the current pulse Ix for the x-axis direction is turned OFF. Due to this, the gradient magnetic field is generated in the y-axis direction in the measurement region 12 and a state is brought about where a measurement position y in the y-axis direction can be selected. In response to this, in the second period T2, the current pulse Ist of the uniform magnetic field for measurement position setting is supplied at a current value Ist2 corresponding to a measurement position Y desired to be set. Due to this, in the second period T2, the measurement of nuclear magnetic resonance is made in a state where the measurement position Y has been selected in the y-axis direction.

A specific example of a method of measuring nuclear magnetic resonance will be described when using the measurement period having the first period and the second period described above and the two kinds of measurement mode, that is, the first measurement mode and the second measurement mode. Here, it is assumed that a measurement position (measurement range) for which an attempt is made to acquire information by nuclear magnetic resonance measurement in the entire measurement region 12 is set to (X, Y).

In the following description, the state of a nuclear spin in the magnetic field before the irradiation of RF pulse is referred to as an "initial state", the state where the nuclear spin is rotated by 90° by the irradiation of 90° pulse is referred to as an "intermediate state", and the state where the nuclear spin is rotated by 180° and oriented in the opposite direction is referred to as an "inversion state". These terms are, however, used only for the description for convenience.

First, nuclear magnetic resonance measurement is made for the measurement region 12 in the first measurement mode that uses the RF pulse shown in the chart (a). In the first period T1, the uniform magnetic field Bst1 by the current Ist1 is applied to the measurement region 12, and thereby the uniform static magnetic field component becomes B0+Bst1 in the region 12. Further, because the current Ix is turned ON, a gradient magnetic field is formed in the x-axis direction. In this state, if the measurement region 12 is irradiated with the 90° pulse of a phase 0°, which is the first RF pulse, nuclear magnetic resonance occurs in a band-like region 121 at the position X at which the position in the x-axis direction is set by the uniform magnetic field Bst1 and the nuclear spin of the atomic nucleus in the initial state is rotated by 90° and enters the intermediate state as shown in FIG. 7(a).

Subsequently, in the second period T2, a uniform magnetic field Bst2 by the current Ist2 is applied to the measurement region 12, and thereby the uniform static magnetic field component becomes B0+Bst2 in the region 12. Further, because the current Iy is turned ON, a gradient magnetic field is formed in the y-axis direction. In this state, if the measurement region 12 is irradiated with the 90° pulse of a phase 0°, which is the second RF pulse, nuclear magnetic resonance occurs in a band-like region 122 at the position Y at which the position in the y-axis direction is set by the uniform magnetic field Bst2 and the nuclear spin of the atomic nucleus in the initial state is rotated by 90° and enters the intermediate state as shown in FIG. 7(b).

At this time, in a region 120 where the band-like regions 121, 122 overlap, that is, in the region 120 corresponding to the measurement position (X, Y), the nuclear spin in the intermediate state where the spin has already been rotated by 90° is further rotated by 90° and enters the inversion state where the nuclear spin is oriented in the opposite direction. In this state, a nuclear magnetic resonance signal is detected and thus a first resonance signal S1 is obtained. After the resonance signal S1 is obtained, the nuclear spin is relaxed or excited, and thereby, the state is returned to the initial state.

Next, the second time nuclear magnetic resonance measurement of the measurement region 12 is made in the second measurement mode that uses the RF pulse shown in the chart (b). In the measurement mode this time also, the measurement in the first period T1 is the same as that in the first time measurement as shown in FIG. 8(a).

Subsequently, in the second period T2, the uniform magnetic field Bst2 by the current Ist2 is applied to the measurement region 12, and thereby the uniform static magnetic field component becomes B0+Bst2 in the region 12. Further, because the current Iy is turned ON, a gradient magnetic field is formed in the y-axis direction. In this state, if the measurement region 12 is irradiated with the 90° pulse of a phase 90°, which is the second RF pulse, nuclear magnetic resonance occurs in the band-like region 122 at the position Y at which the position in the y-axis direction is set by the uniform magnetic field Bst2 and the nuclear spin of the atomic nucleus in the initial state is rotated by 90° and enters the intermediate state as shown in FIG. 8(b).

At this time, in the region 120 where the band-like regions 121, 122 overlap, that is, in the region 120 corresponding to the measurement position (X, Y), the phase of the second RF pulse is set to 90°, not to 0°, and therefore, the nuclear spin in the intermediate state where the nuclear spin has been rotated by 90° remains in the intermediate state. In this state, a nuclear magnetic resonance signal is detected and thus a second resonance signal S2 is obtained.

From the above measurements, it is possible to acquire local nuclear spin information at the measurement position (X, Y) by subtracting the second resonance signal S2 from the first resonance signal S1. Further, in this method, the measurement position (X, Y) is set by the uniform magnetic field (Bst1, Bst2), that is, the current (Ist1, Ist2) supplied to the uniform magnetic field electrode 25. Consequently, it is possible to scan the measurement position in the measurement region 12 and acquire the image information on the measurement object 13 in the measurement region 12 by controlling these current values.

For example, when such a nuclear magnetic resonance imaging system is applied to a local detection device of quantum bit in a quantum computer etc. in which the nuclear spin in the nano-region is used as a quantum bit, it is made possible to select a quantum bit to be read by controlling the above-described current values. Further, the nuclear magnetic resonance imaging device and the imaging system described above can be widely applied to various measuring fields, advanced research fields, etc., as an MRI device with a high resolution.

Here, in the nuclear magnetic resonance imaging device 1A with the above-described configuration, the resolution of the measurement position set by a magnetic field applied by the electrode group 20 is determined by the conditions, such as the distance between electrodes of a pair of split electrodes for a gradient magnetic field and the value of current supplied to the gradient magnetic field electrode.

That is, with the above-described configuration, the peak of the nuclear magnetic resonance has an finite width at the time of reading of nuclear magnetic resonance, and therefore, it is possible to estimate a difference between energies required to separate the width, that is, a difference between frequencies. On the other hand, it is possible to calculate the intensity of the gradient magnetic field obtained by the arrangement of electrodes in the magnetic field applying electrode group and to calculate the shift amount of the energy of nuclear magnetic resonance obtained at that time. Consequently, the value of magnetic field (value of current supplied to electrode) necessary to obtain a desired position resolution can be found as a function of the distance between electrodes of the split electrodes and its resolution is determined by the distance between electrodes and the value of current to be supplied, as a result.

For example, in order to attain a measurement position resolution of 500 nm or less, it is necessary to set a ratio of the distance between electrodes to the current value for the above-described gradient magnetic field to 50 m/A or less. As a specific example, with the configuration in which the distance between electrodes of a pair of split electrodes for gradient magnetic field (substantially corresponding to the inner width of the loop shape of the uniform magnetic field electrode) is set to 50 µm, as described above, when the value of current to be supplied is set to 100 µA, the obtained position resolution is about 5 nm.

As to the current to be supplied to the uniform magnetic field electrode, it is preferable to set the value of current to about the same level of the value of current at the gradient magnetic field electrode. Such a condition can be realized by, for example, appropriately setting the value of a magnetic field to be applied from the static magnetic field applying device.

The nuclear magnetic resonance imaging device, and the imaging system and the imaging method using the same according to the present invention are not limited to the embodiments and configuration examples described above, but there can be various modifications. For example, as to the specific electrode pattern of each electrode constituting the magnetic field applying electrode group, various configurations other than the configuration shown in FIG. 1 may be used. In general, a magnetic field applying electrode group integrated on a substrate has only to be configured so as to have a uniform magnetic field electrode that applies a uniform magnetic field to a measurement region in accordance with a measurement position to be set, a first gradient magnetic field electrode that applies a gradient magnetic field to the measurement region in a first axis direction parallel to the measurement surface of the substrate, and a second gradient magnetic field electrode that applies a gradient magnetic field to the measurement region in a second axis direction parallel to the measurement surface and perpendicular to the first axis.

In addition, as to the substrate in the imaging device, the electrode group, the lamination structure of RF antenna, etc., various configurations may be used, not limited to the configurations described above. As to the specific imaging method using the imaging device with the above-described configuration, various methods can be used in accordance with the type and placement of the specific measurement object, the configuration of electrode group, etc., not limited to the methods described above.

Figure 9:
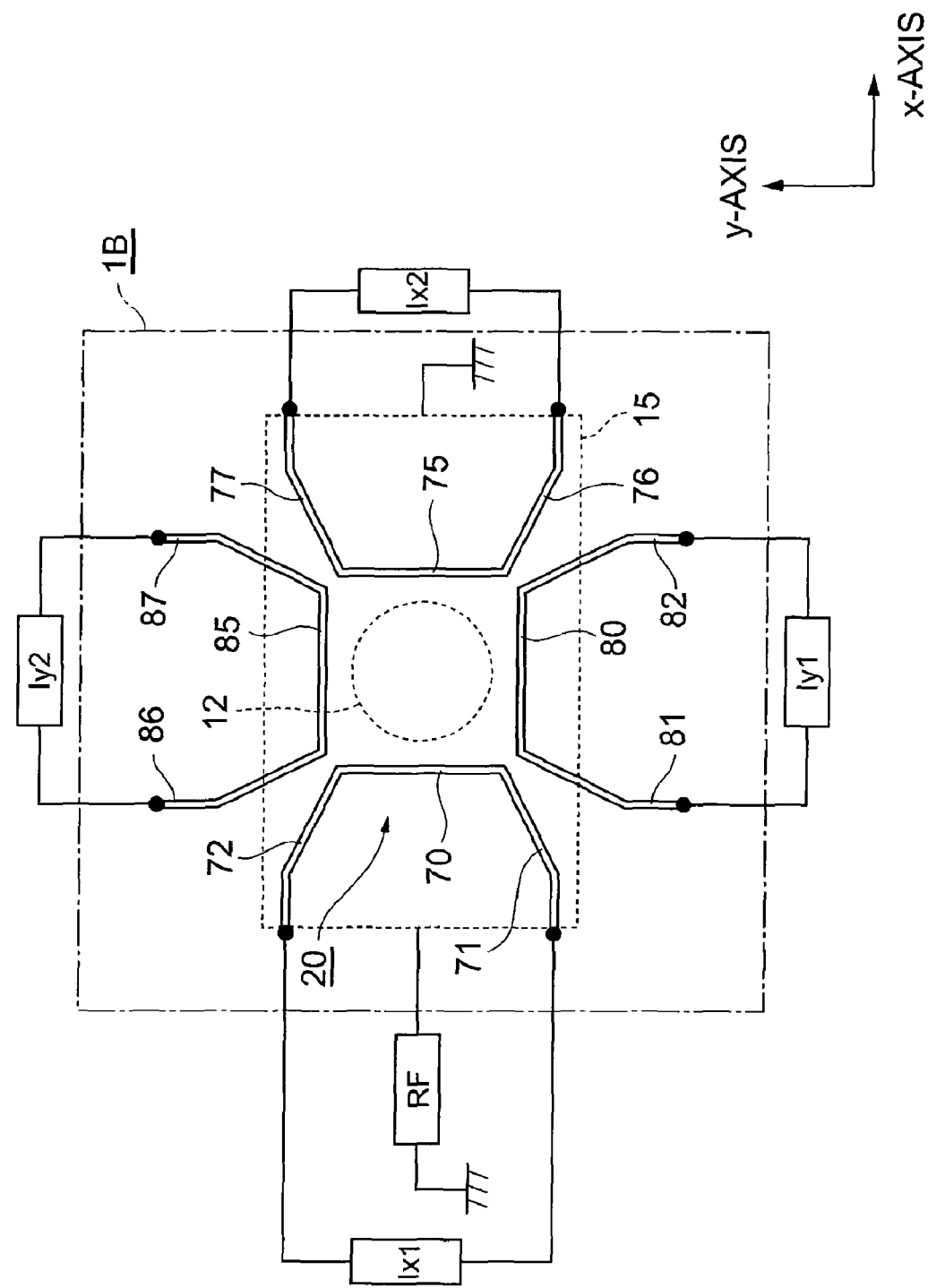
FIG. 9 is a diagram schematically illustrating a planar configuration of another embodiment of the nuclear magnetic resonance imaging device.

The configuration of the nuclear magnetic resonance imaging device according to the present invention will be further described. FIG. 9 is a diagram that schematically illustrates the planar configuration of a nuclear magnetic resonance imaging device in another embodiment. A nuclear magnetic resonance imaging device 1B in the present embodiment comprises the substrate 10, the magnetic field applying electrode group 20, and the RF antenna 15. In the configuration shown in FIG. 9, the magnetic field applying electrode group 20 comprises four split electrodes 70, 75, 80 and 85.

The split electrode 70 is formed into a straight electrode pattern on the left-hand side when viewed from the measurement region 12 and wirings 71, 72 for supplying a current are provided respectively at both ends thereof. The split electrode 75 is formed into a straight electrode pattern on the right-hand side when viewed from the region 12 and wirings 76, 77 for supplying a current are provided respectively at both ends thereof.

The split electrode 80 is formed into a straight electrode pattern on the lower side when viewed from the measurement region 12 and wirings 81, 82 for supplying a current are provided respectively at both ends thereof. The split electrode 85 is formed into a straight electrode pattern on the upper side when viewed from the region 12 and wirings 86, 87 for supplying a current are provided respectively at both ends thereof.

In such a configuration, a uniform magnetic field electrode that applies a uniform magnetic field to the measurement region 12 is configured by a loop-shaped electrode pattern that puts together the four split electrodes 70, 75, 80 and 85. The first gradient magnetic field electrode that applies a gradient magnetic field in the x-axis direction is configured by a pair of the split electrodes 70, 75. Similarly, the second gradient magnetic field electrode that applies a gradient magnetic field in the y-axis direction is configured by a pair of the split electrodes 80, 85.

Figure 10:
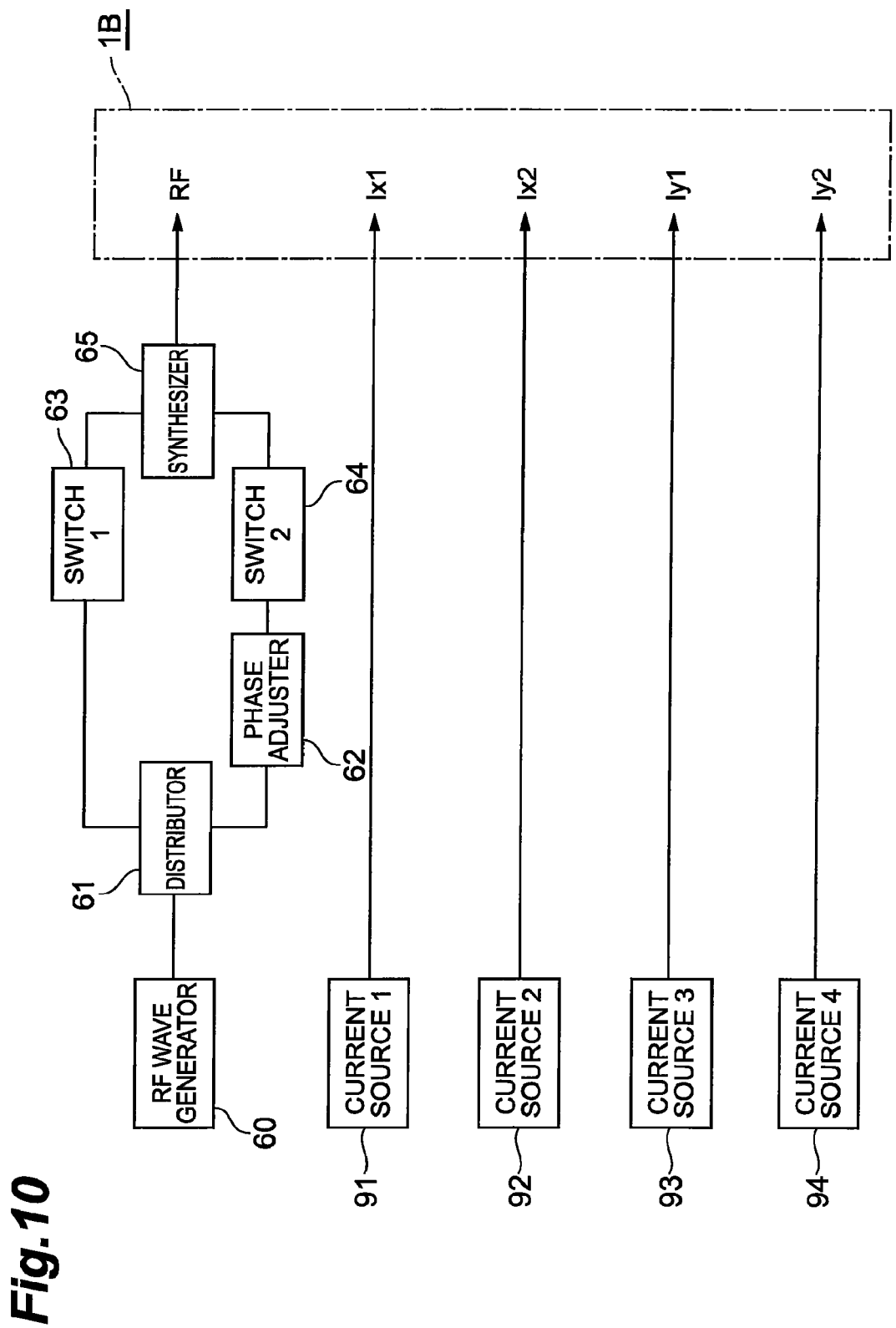
FIG. 10 is a block diagram illustrating a configuration of another embodiment of the nuclear magnetic resonance imaging system.

Next, a nuclear magnetic resonance imaging system according to the present invention using the above-described imaging device 1B will be described. FIG. 10 is a block diagram illustrating a configuration of a nuclear magnetic resonance imaging system in another embodiment. The imaging system in the present embodiment comprises the nuclear magnetic resonance imaging device 1B and current sources 91 to 94. In the present embodiment, the RF pulse supply means including the RF generator 60 has the same configuration as that shown in FIG. 3. In FIG. 10, the schematic representation of the static magnetic field applying device 22, the detector 54, and the controller 56 is omitted.

The first current source 91 is one for supplying a current Ix1 to the electrode 70 of the imaging device 1B and is connected between the wirings 71, 72, as shown in FIG. 9. The second current source 92 is one for supplying a current Ix2 to the electrode 75 and is connected between the wirings 76, 77. The third current source 93 is one for supplying a current Iy1 to the electrode 80 and is connected between the wirings 81, 82. The fourth current source 94 is one for supplying a current Iy2 to the electrode 85 and is connected between the wirings 86, 87.

In such a configuration, a uniform magnetic field current source that supplies a current to the uniform magnetic field electrode is configured by the four current sources 91 to 94. A first gradient magnetic field current source that supplies a current to the first gradient magnetic field electrode is configured by the two current sources 91, 92. A second gradient magnetic field current source that supplies a current to the second gradient magnetic field electrode is configured by the two current sources 93, 94.

In the above-described configuration, the current Ix1 supplied to the split electrode 70 on the left-hand side is a sum of the currents supplied to the left side of the loop electrode 25 and the split electrode 30 in the configuration in FIG. 1. The current Ix2 supplied to the split electrode 75 on the right-hand side is a sum of the currents supplied to the right side of the loop electrode 25 and the split electrode 35. It should be noted here that the direction of current of the left side of the loop electrode 25 differs from that of the right side.

Similarly, in the above-described configuration, the current Iy1 supplied to the split electrode 80 on the lower side is a sum of the currents supplied to the bottom side of the loop electrode 25 and the split electrode 40. The current Iy2 supplied to the split electrode 85 on the upper side is a sum of the currents supplied to the top side of the loop electrode 25 and the split electrode 45. It should be noted here that the direction of current of the bottom side of the loop electrode 25 differs from that of the top side as in the left side and the right side.

As shown in the embodiment in FIG. 9 and FIG. 10, as to the configurations of the electrode pattern of each electrode constituting the magnetic field applying electrode group and the current source that supplies a current to those electrodes, various configurations can be used specifically.

Here, the nuclear magnetic resonance imaging (MRI) device according to the above-described embodiment comprises a substrate, a magnetic field applying electrode group provided being integrated on a measurement surface, which is one surface of the substrate, for setting a local measurement position in a measurement region of nuclear magnetic resonance set in a predetermined region with respect to the substrate by applying a magnetic field to the measurement region, and RF irradiation means provided at a predetermined position with respect to the substrate for irradiating the measurement region of the substrate with an RF pulse, wherein the magnetic field applying electrode group includes, a uniform magnetic field electrode applying a uniform magnetic field to the measurement region in accordance with the measurement position to be set, a first gradient magnetic field electrode applying a gradient magnetic field to the measurement region in a first axis direction parallel to the measurement surface of the substrate, and a second gradient magnetic field electrode applying a gradient magnetic field to the measurement region in a second axis direction parallel to the measurement surface and perpendicular to the first axis.

As to the specific configuration of the magnetic field applying electrode group in the above-described imaging device, it is preferable that the uniform magnetic field electrode include a loop electrode formed so as to surround the measurement region, the first gradient magnetic field electrode include a pair of first split electrodes formed so as to sandwich the measurement region in the first axis direction, and the second gradient magnetic field electrode include a pair of second split electrodes formed so as to sandwich the measurement region in the second axis direction. Due to this, it is possible to realize the application of the uniform magnetic field, the gradient magnetic field in the first axis direction, and the gradient magnetic field in the second axis direction to the measurement region using the three kinds of electrode with a simple electrode configuration that can be integrated onto the substrate.

Alternatively, in the magnetic field applying electrode group, such a configuration may be accepted, in which the first gradient magnetic field electrode includes a pair of first split electrodes formed so as to sandwich the measurement region in the first axis direction, the second gradient magnetic field electrode includes a pair of second split electrodes formed so as to sandwich the measurement region in the second axis direction, and the uniform magnetic field electrode is configured by a loop-shaped electrode pattern in which the pair of the first split electrodes and the pair of the second split electrodes are combined. With such a configuration also, it is possible to realize the application of the uniform magnetic field, the gradient magnetic field in the first axis direction, and the gradient magnetic field in the second axis direction to the measurement region with a simple electrode configuration that can be integrated onto the substrate. Further, as to the specific electrode configuration of electrode group, various configurations may be used other than the above.

As to the electrode pattern constituting the magnetic field applying electrode group, it is preferable that, in the magnetic field applying electrode group, the pattern width of each electrode constituting the electrode group fall within a range of 10 nm to 10 μm. In addition, it is also preferable that, in the magnetic field applying electrode group, the thickness of each electrode constituting the electrode group fall within a range of 200 nm to 1 μm. In addition, it is also preferable that, in the magnetic field applying electrode group, the inner width of the electrode pattern constituting the electrode group fall within a range of 100 nm to 100 μm.

As to the RF irradiation means used to irradiate the measurement region with the RF pulse, a configuration can be used, which includes an RF antenna formed being insulated by an insulating layer from the magnetic field applying electrode group on the measurement surface of the substrate. Alternatively, a configuration can be used, which includes an RF antenna formed on the opposite surface of the measurement surface of the substrate. In these configurations, the RF antenna is integrated on the substrate together with the magnetic field applying electrode group.

As to the measurement object, which is the object of image acquisition by the imaging device, it is preferable that the measurement object in the measurement region be placed on the measurement surface of the substrate or within the substrate at a predetermined depth from the measurement surface.

The nuclear magnetic resonance imaging system in the above-described embodiment uses a configuration comprising a nuclear magnetic resonance imaging device having the above-described configuration, a uniform magnetic field current source supplying a current for generating a uniform magnetic field to the uniform magnetic field electrode, a first gradient magnetic field current source supplying a current for generating a gradient magnetic field to the first gradient magnetic field electrode, a second gradient magnetic field current source supplying a current for generating a gradient magnetic field to the second gradient magnetic field electrode, RF pulse supply means supplying an RF pulse to the RF irradiation means, detection means detecting a nuclear magnetic resonance signal from a measurement object in the measurement region of the nuclear magnetic resonance imaging device, and imaging control means controlling the imaging of a measurement object by means of nuclear magnetic resonance.

The nuclear magnetic resonance imaging method in the above-described embodiment uses a configuration using the nuclear magnetic resonance imaging device with the above-described configuration and comprising the steps of: supplying a current for generating a magnetic field as needed, to each of the uniform magnetic field electrode, the first gradient magnetic field electrode, and the second gradient magnetic field electrode, supplying the RF pulse to the RF irradiation means, detecting a nuclear magnetic resonance signal from a measurement object in the measurement region of the nuclear magnetic resonance imaging device, and controlling imaging of the measurement object by means of nuclear magnetic resonance.

Here, it is preferable that the imaging control means in the imaging system select an axis direction in which the measurement position is set by controlling supply of a current to the first gradient magnetic field electrode or the second gradient magnetic field electrode and thereby controlling a gradient magnetic field applied to the measurement region, and scan the measurement position in the measurement region by controlling supply of a current to the uniform magnetic field electrode and thereby controlling a uniform magnetic field applied to the measurement region.

Similarly, it is preferable that the imaging control step in the imaging method select an axis direction in which the measurement position is set by controlling supply of a current to the first gradient magnetic field electrode or the second gradient magnetic field electrode and thereby controlling a gradient magnetic field applied to the measurement region, and scan the measurement position in the measurement region by controlling supply of a current to the uniform magnetic field electrode and thereby controlling a uniform magnetic field applied to the measurement region.

In this manner, it is possible to preferably realize the setting, changing, and scanning of the measurement position in the measurement region by selecting the axial direction for the measurement position setting by applying the gradient magnetic field using the gradient magnetic field electrode and controlling the setting or changing of the magnitude of the uniform magnetic field applied to the measurement region by the uniform magnetic field electrode.

In the imaging system, it is preferable that the imaging control means carry out imaging of the measurement object by means of nuclear magnetic resonance using a measurement period including: a first period during which the measurement region is irradiated with the RF pulse in a state where the measurement position is selected being applied with the gradient magnetic field in the first axis direction, with the supply of a current to the first gradient magnetic field electrode turned ON and the supply of a current to the second gradient magnetic field electrode turned OFF, and a second period during which the measurement region is irradiated with the RF pulse in a state where the measurement position is selected being applied with the gradient magnetic field in the second axis direction, with the supply of a current to the second gradient magnetic field electrode turned ON and the supply of a current to the first gradient magnetic field electrode turned OFF.

Similarly, in the imaging method, it is preferable that the imaging control step carry out imaging of the measurement object by means of nuclear magnetic resonance using a measurement period including, a first period during which the measurement region is irradiated with the RF pulse in a state where the measurement position is selected being applied with the gradient magnetic field in the first axis direction, with the supply of a current to the first gradient magnetic field electrode turned ON and the supply of a current to the second gradient magnetic field electrode turned OFF, and a second period during which the measurement region is irradiated with the RF pulse in a state where the measurement position is selected being applied with the gradient magnetic field in the second axis direction, with the supply of a current to the second gradient magnetic field electrode turned ON and the supply of a current to the first gradient magnetic field electrode turned OFF.

In such a configuration, measurement is made in a state where the measurement position (x coordinate) is selected in the first axis (x-axis) direction in the first period and measurement is made in a state where the measurement position (y coordinate) is selected in the second axis (y-axis) direction in the second period, and with both the measurements being combined, it is made possible to acquire information about the measurement object in a state where the measurement position (x, y) is selected in both of the first axis and the second axis directions.

In the imaging system, it is preferable that the imaging control means use, for a measurement mode during the measurement period, two kinds of measurement mode, including: a first measurement mode in which a 90° pulse of a predetermined phase is used as the RF pulse in the first period and a 90° pulse of the same phase as that in the first period is used as the RF pulse in the second period, and a second measurement mode in which a 90° pulse of a predetermined phase is used as the RF pulse in the first period and a 90° pulse of a phase different (preferably, 90° different) from that in the first period is used as the RF pulse in the second period.

Similarly, in the imaging method, it is preferable that the imaging control step use, for a measurement mode during the measurement period, two kinds of measurement mode, including: a first measurement mode in which a 90° pulse of a predetermined phase is used as the RF pulse in the first period and a 90° pulse of the same phase as that in the first period is used as the RF pulse in the second period, and a second measurement mode in which a 90° pulse of a predetermined phase is used as the RF pulse in the first period and a 90° pulse of a phase different from that in the first period is used as the RF pulse in the second period.

In such a configuration, in the nuclear magnetic resonance measurement during the measurement period including the first period and the second period described above, the nuclear magnetic resonance signal is detected respectively in the two kinds of measurement mode in which the irradiation conditions of RF pulse to the measurement region are different, and with both the detection results being combined, it is made possible to securely acquire local information about the set measurement position (x, y).

INDUSTRIAL APPLICABILITY

The present invention can be utilized as a nuclear magnetic resonance imaging device capable of carrying out image acquisition of a measurement object using a nuclear magnetic resonance imaging method with a high resolution, and an imaging system and imaging method using the same.

The invention claimed is:

1. A nuclear magnetic resonance imaging device comprising:
    a substrate;
    a magnetic field applying electrode group provided being integrated on a measurement surface, which is one surface of the substrate, for setting a local measurement position in a measurement region of nuclear magnetic resonance set in a predetermined region with respect to the substrate by applying a magnetic field to the measurement region; and
    RF irradiation means provided at a predetermined position with respect to the substrate for irradiating the measurement region of the substrate with an RF pulse, wherein
    the magnetic field applying electrode group includes:
    a uniform magnetic field electrode applying a uniform magnetic field to the measurement region in accordance with the measurement position to be set;
    a first gradient magnetic field electrode applying a gradient magnetic field to the measurement region in a first axis direction parallel to the measurement surface of the substrate; and
    a second gradient magnetic field electrode applying a gradient magnetic field to the measurement region in a second axis direction parallel to the measurement surface and perpendicular to the first axis.

2. The imaging device according to claim 1, wherein
    in the magnetic field applying electrode group:
    the uniform magnetic field electrode includes a loop electrode formed so as to surround the measurement region;
    the first gradient magnetic field electrode includes a pair of first split electrodes formed so as to sandwich the measurement region in the first axis direction; and
    the second gradient magnetic field electrode includes a pair of second split electrodes formed so as to sandwich the measurement region in the second axis direction.

3. The imaging device according to claim 1, wherein
    in the magnetic field applying electrode group:
    the first gradient magnetic field electrode includes a pair of first split electrodes formed so as to sandwich the measurement region in the first axis direction;
    the second gradient magnetic field electrode includes a pair of second split electrodes formed so as to sandwich the measurement region in the second axis direction; and
    the uniform magnetic field electrode is configured by a loop-shaped electrode pattern in which the pair of the first split electrodes and the pair of the second split electrodes are combined.

4. The imaging device according to claim 1, wherein
    a pattern width of each electrode constituting the magnetic field applying electrode group falls within a range of 10 nm to 10 μm.

5. The imaging device according to claim 1, wherein
    an inner width of the electrode pattern constituting the magnetic field applying electrode group falls within a range of 100 nm to 100 μm.

6. The imaging device according to claim 1, wherein
    the RF irradiation means includes an RF antenna formed insulated by an insulating layer from the magnetic field applying electrode group on the measurement surface of the substrate.

7. The imaging device according to claim 1, wherein
    the RF irradiation means includes an RF antenna formed on the opposite surface of the measurement surface of the substrate.

8. The imaging device according to claim 1, wherein
    a measurement object in the measurement region is placed on the measurement surface of the substrate or at a predetermined depth from the measurement surface in the substrate.

9. A nuclear magnetic resonance imaging system comprising:
    a nuclear magnetic resonance imaging device according to claim 1:
    a uniform magnetic field current source supplying a current for generating a uniform magnetic field to the uniform magnetic field electrode;
    a first gradient magnetic field current source supplying a current for generating a gradient magnetic field to the first gradient magnetic field electrode;
    a second gradient magnetic field current source supplying a current for generating a gradient magnetic field to the second gradient magnetic field electrode;
    RF pulse supply means supplying the RF pulse to the RF irradiation means;
    detection means detecting a nuclear magnetic resonance signal from a measurement object in the measurement region of the nuclear magnetic resonance imaging device; and
    imaging control means controlling imaging of the measurement object by means of nuclear magnetic resonance.

10. The imaging system according to claim 9, wherein
    the imaging control means:
    selects an axis direction in which the measurement position is set by controlling supply of a current to the first gradient magnetic field electrode or the second gradient magnetic field electrode and thereby controlling a gradient magnetic field applied to the measurement region; and
    scans the measurement position in the measurement region by controlling supply of a current to the uniform magnetic field electrode and thereby controlling a uniform magnetic field applied to the measurement region.

11. The imaging system according to claim 9, wherein
    the imaging control means carries out imaging of the measurement object by means of nuclear magnetic resonance using a measurement period including:
    a first period during which the measurement region is irradiated with the RF pulse in a state where the measurement position is selected being applied with the gradient magnetic field in the first axis direction, with the supply of a current to the first gradient magnetic field electrode turned ON and the supply of a current to the second gradient magnetic field electrode turned OFF; and a second period during which the measurement region is irradiated with the RF pulse in a state where the measurement position is selected being applied with the gradient magnetic field in the second axis direction, with the supply of a current to the second gradient magnetic field electrode turned ON and the supply of a current to the first gradient magnetic field electrode turned OFF.

12. The imaging system according to claim 11, wherein the imaging control means uses, for a measurement mode during the measurement period, two kinds of measurement mode, including:
a first measurement mode in which a 90° pulse of a predetermined phase is used as the RF pulse in the first period and a 90° pulse of the same phase as that in the first period is used as the RF pulse in the second period; and
a second measurement mode in which a 90° pulse of a predetermined phase is used as the RF pulse in the first period and a 90° pulse of a phase different from that in the first period is used as the RF pulse in the second period.

13. A nuclear magnetic resonance imaging method, using a nuclear magnetic resonance imaging device according to claim 1 and comprising:
a current supply step of supplying a current for generating a magnetic field as needed, to each of the uniform magnetic field electrode, the first gradient magnetic field electrode, and the second gradient magnetic field electrode;
an RF pulse supply step of supplying the RF pulse to the RF irradiation means;
a detection step of detecting a nuclear magnetic resonance signal from a measurement object in the measurement region of the nuclear magnetic resonance imaging device; and
an imaging control step of controlling imaging of the measurement object by means of nuclear magnetic resonance.

14. The imaging method according to claim 13, wherein the imaging control step:
selects an axis direction in which the measurement position is set by controlling supply of a current to the first gradient magnetic field electrode or the second gradient magnetic field electrode and thereby controlling a gradient magnetic field applied to the measurement region; and
scans the measurement position in the measurement region by controlling supply of a current to the uniform magnetic field electrode and thereby controlling a uniform magnetic field applied to the measurement region.

15. The imaging method according to claim 13, wherein the imaging control step carries out imaging of the measurement object by means of nuclear magnetic resonance using a measurement period including:
a first period during which the measurement region is irradiated with the RF pulse in a state where the measurement position is selected being applied with the gradient magnetic field in the first axis direction, with the supply of a current to the first gradient magnetic field electrode turned ON and the supply of a current to the second gradient magnetic field electrode turned OFF; and
a second period during which the measurement region is irradiated with the RF pulse in a state where the measurement position is selected being applied with the gradient magnetic field in the second axis direction, with the supply of a current to the second gradient magnetic field electrode turned ON and the supply of a current to the first gradient magnetic field electrode turned OFF.

16. The imaging method according to claim 15, wherein the imaging control step uses, for a measurement mode during the measurement period, two kinds of measurement mode, including:
a first measurement mode in which a 90° pulse of a predetermined phase is used as the RF pulse in the first period and a 90° pulse of the same phase as that in the first period is used as the RF pulse in the second period; and
a second measurement mode in which a 90° pulse of a predetermined phase is used as the RF pulse in the first period and a 90° pulse of a phase different from that in the first period is used as the RF pulse in the second period.

* * * * *

UNITED STATES PATENT AND TRADEMARK OFFICE
CERTIFICATE OF CORRECTION

| | |
|---|---|
| PATENT NO. | : 8,093,898 B2 |
| APPLICATION NO. | : 12/516646 |
| DATED | : January 10, 2012 |
| INVENTOR(S) | : Yusa |

It is certified that error appears in the above-identified patent and that said Letters Patent is hereby corrected as shown below:

Title page, Item (54) and Column 1 in the Title:

insert --IMAGING-- before METHOD.

Column 22, Claim 9, Line 26, delete ":" and insert --;-- therefor.

Signed and Sealed this
Fifth Day of June, 2012

David J. Kappos
*Director of the United States Patent and Trademark Office*